US006649938B1

(12) United States Patent
Bogatov et al.

(10) Patent No.: US 6,649,938 B1
(45) Date of Patent: *Nov. 18, 2003

(54) SEMICONDUCTOR OPTICAL AMPLIFIER

(75) Inventors: Alexandr P. Bogatov, Moscow (RU);
Alexandr E. Drakin, Moscow (RU);
Juri V Kurnyavko, Moscow (RU);
Vasily I. Shveikin, Moscow (RU)

(73) Assignee: D-Led Corporation, Miami, FL (US)

( * ) Notice: Subject to any disclaimer, the term of this patent is extended or adjusted under 35 U.S.C. 154(b) by 200 days.

This patent is subject to a terminal disclaimer.

(21) Appl. No.: 09/658,642

(22) Filed: Sep. 11, 2000

Related U.S. Application Data

(63) Continuation-in-part of application No. PCT/RU99/00067, filed on Mar. 11, 1999.

(30) Foreign Application Priority Data

Mar. 12, 1998 (RU) .............................. 98103653

(51) Int. Cl.$^7$ .............................. H01L 33/00; H01S 5/00
(52) U.S. Cl. .............................. 257/95; 257/98; 257/103; 372/49; 372/50
(58) Field of Search .............................. 359/344; 372/43, 372/45, 46, 50, 49; 257/95, 96, 98, 101, 103

(56) References Cited

U.S. PATENT DOCUMENTS

| 4,063,189 A | 12/1977 | Scifres et al. |
|---|---|---|
| 5,101,413 A | 3/1992 | Botez |
| 5,537,433 A | 7/1996 | Watanabe |
| 5,705,834 A | 1/1998 | Egalon et al. |
| 5,779,924 A | 7/1998 | Krames et al. |
| 5,793,062 A | 8/1998 | Kish, Jr. et al. |
| 5,818,860 A | 10/1998 | Garbuzov |
| 6,057,562 A | 5/2000 | Lee et al. |
| 6,429,462 B1 * | 8/2002 | Shveykin .............................. 257/95 |

FOREIGN PATENT DOCUMENTS

| EP | 0 247 267 B1 | 10/1991 |
|---|---|---|
| EP | 0727827 | 8/1996 |
| EP | 0849812 | 6/1998 |
| JP | 60-211993 | * 10/1985 |
| RU | 1455373 | 1/1989 |
| RU | 2133534 | 7/1999 |
| RU | 2134007 | 7/1999 |
| RU | 2142661 | 12/1999 |
| RU | 2142665 | 12/1999 |
| SU | 1359833 A1 | 7/1984 |
| SU | 1329533 A1 | 5/1988 |
| WO | WO 85/03809 | 8/1985 |
| WO | WO 99/08352 | 2/1999 |
| WO | WO 00/10235 | 2/2000 |
| WO | WO 00/39860 | 7/2000 |

OTHER PUBLICATIONS

*Resonant Cavity LED's Optimized for Coupling to Polymer Optical Fibers*, Ronny Bockstaele et al.,*IEEE Photonics Technology Letters*, vol. 11, No. 2, Feb. 1999, pp. 158–160.

(List continued on next page.)

*Primary Examiner*—Minh Loan Tran
(74) *Attorney, Agent, or Firm*—Knobbe, Martens, Olson & Bear LLP

(57) ABSTRACT

A semiconductor optical amplifier includes a master source of input radiation, an amplifying component optically coupled to the master source. The amplifying component includes a semiconductor heterostructure that includes an active layer positioned between two cladding layers and an ohmic contact formed to at least one sublayer of the semiconductor heterostructure. The amplifying component also includes an input-output region for radiation that comprises at least one additional layer on at least one side of the heterostructure. This additional layer adjacent to the heterostructure comprises one or more sublayers having refractive indices $n_{IORq}$ and optical loss factors $\alpha_{IORq}$ (cm$^{-1}$) selected to provide for enhanced output power and a reduced angle of divergence.

56 Claims, 11 Drawing Sheets

OTHER PUBLICATIONS

*High–power 1.3 μm superluminescent diode*, Norman S. K. Kwong et al., *Applied Physics Letters*, vol. 54, No. 4, Jan. 23, 1989, pp. 298–300.

*Analysis of Semiconductor Laser Optical Amplifiers*, M. J. Adams et al., *IEEE Proceedings*, vol. 132, Pt. J, No. 1, Feb. 1985, pp. 58–63.

*Directional radiation pattern of quantum–dimensional InCaAs/GaAs leaky–mode lasers*, V.I. Shveikin et al., *Quantum Electronics*, vol. 26, No. 1, 1999, pp. 33–36.

*Dynamics of the optical damage of output mirrors of ridge semiconductor lasers based on strained quantum–well heterostructures*, I.V. Akimova et al., *Kvantovaya Elektronicka*, vol. 25, No. 7, 1998, pp. 647–650, translated by A. Tybulewicz in *Quantum Electronics*, vol. 28, No. 7, 1998, pp. 629–632.

*High–Efficiency InGaAlP Visible Light–Emitting Diodes*, Hideto Sugawara et al., *Japanese Journal of Applied Physics*, vol. 31, No. 8, Aug. 1992, pp. 2446–2451.

*Room–Temperature CW Operation of InGaAsP Lasers on Si Fabricated by Wafer Bonding*, Hiroshi Wada et al., *IEEE Photonics Technology Letters*, vol. 8, No. 2, Feb. 1996, pp. 173–175.

*Chemically Assisted Ion Beam Etching of GaAs, Ti, and Mo*, J.D. Chinn et al., *J. Vac Sci. Technol. A.*, vol. 1, No. 2, Apr.–Jun. 1983, 1983 American Vacuum Society, pp. 701–704.

*High–Power Superluminescent Diodes*, Gerard A. Alphonse et al., *IEEE Journal of Quantum Elecronics*, vol. 24, No. 12, Dec. 1988, pp. 2454–2457.

*Thin–Films Field–Transfer Matrix Theory of Planar Multilayer Waveguides and Reflection From Prism–Loaded Waveguides*, John Chilwell et al., *J. Opt. Soc. Am. A.*, vol. 1, No. 7, Jul. 1984, 1984 Optical Society of America, pp. 742–753.

*Wide Spectrum Single Quantum Well Superluminescent Diodes at 0·μm With Bent Optical Waveguide*, A.T. Semenov et al., *Electronics Letters*, $13^{th}$ May 1993, vol. 29, No. 10, pp. 854–857.

*Superluminescent Diodes with Bent Waveguide*, Ching Fuh Lin et al., *IEEE Photonics Technology Letters*, vol. 8, No. 2, Feb. 1996, pp. 206–208.

*Low spectral modulation high–power output from a new AlGaAs superluminescent diode/optical amplifier structure*, G.A. Alphonse et al., *Applied Physics Letters* 55 (22), Nov. 27, 1989, pp. 2289–2291.

*Resonant Cavity LED's Optimized for Coupling to Polymer Optical Fibers*, Ronny Bockstaele et al., *IEEE Photonics Technology Letters*, vol. 11, No. 2, Feb. 1999, pp. 158–160.

*P–GaN/N–InGaN/N–GaN Double Heterostructure Blue–Light Emitting Diodes*, Shuji Nakamura et al., *Japanese Journal of Applied Physics*, vol. 32 (1993), pp. L8–L11, Part 2, No. 1A/B, Jan. 15, 1993.

*High–Brightness AlGaInP 573–nm Light–Emitting Diode with A Chirped Multiquantum Barrier*, C.S. Chang et al., *IEEE Journal of Quantum Electronics*, vol. 34, No. 1, Jan. 1998, pp. 77–83.

*Very high–efficiency semiconductor wafer–bonded transparent–substrate $(Al_xGa_{1-x})_{0.5}In_{0.5}P/GaP$ light–emitting diodes*, F.A. Kish et al., *Applied Physics Letters*, vol. 64, No. 21, May 23, 1994, pp. 2839–2841.

*Superbright Green InGaN Single–Quantum–Well–Structure Light–Emitting Diodes*, Shuji Nakamura et al., *Jpn. J. Appl. Phys.*, vol. 34 (1995), pp. L1332–L1335, Part 2, No. 10B, Oct. 15, 1995.

*Internal Optical Losses in Very Thin CW Heterojunction Laser Diodes*, J.K. Butler et al., *IEEE Journal of Quantum Electronics*, vol. QE–11, No. 7, Jul. 1975, pp. 402–408.

*Room–Temperature CW Operation of InGaAsP Lasers on Si Fabricated by Wafer Bonding*, Hiroshi Wada et al., *IEEE Photonics Technology Letters*, vol. 8, No. 2, Feb. 1996, pp. 173–175.

*Light–Emitting Diodes with 17*

External Quantum Efficiency at 622 Mb/s for High–Bandwidth Parallel Short–Distance Optical Interconnects, Reiner H. Windisch et al., *IEEE Journal of Selected Topics in Quantum Elecronics*, vol. 5, No. 2, Mar./Apr. 1999, pp. 166–171.

*High Brightness Visible (660 nm) Resonant–Cavity Light–Emitting Diode*, K. Streubel et al., *IEEE Photonics Technology Letters*, vol. 10, No. 12, Dec. 1998, pp. 1685–1687.

*100–mW High–Power Angled–Stripe Superluminescent Diodes with a New Real Refractive–Index–Guided Self–Aligned Structure*, Toru Takayama et al., *IEEE Journal of Quantum Electronics*, vol. 32, No. 11, Nov. 1996, pp. 1981–1987.

*High–power, high–efficiency 1.3 μm superluminescent diodes with a buried bent absorbing guide structure*, Haruo Nagai et al., *Applied Physics Letters*, vol. 54, No. 18, May 1989, pp. 1719–1721.

*High power, high efficiency window buried heterostructure GaAAlAs superluminescent diode with an integrated absorber*, Norman S.K. Kwong et al., *Applied Physics Letters*, vol. 51, No. 23, Dec. 1987, pp. 1879–1881.

*Optical Properties of a GaAlAs Superluminescent Diode*, Niloy K. Dutta et al., *IEEE Journal of Quantum Electronics*, vol. QE–19, No. 4, Apr. 1983, pp. 496–498.

*Measurement of the Modal Reflectivity of an Antireflection Coating on a Superluminescent Diode*, I. P. Kaminow et al., *IEEE Journal of Quantum Electronics*, vol. QE–19, No. 4, Apr. 1983, pp. 493–495.

*980–nm Master Oscillator Power Amplifiers with Non–absorbing Mirrors*, R.M. Lammert et al., *IEEE Photonics Technology Letters*, vol. 11, No. 9, Sep. 1999, pp. 1099–1101.

*High–Power Near–Diffraction–Limited Tapered Amplifiers at 1064 nm for Optical Intersatellite Communications*, P. Chazan et al., *IEEE Photonics Technology Letters*, vol. 10, No. 11, Nov. 1998, pp. 1542–1544.

*Extremely Low Power Consumption Semiconductor Optical Amplifier Gate for WDM Applications*, T. Ito et al., *Electronics Letters*, vol. 33, No. 21, Oct. 9, 1997, pp. 1791–1792.

*5–W CW Diffraction–Limited InGaAs Broad–Area Flared Amplifier at 970 nm*, S. O'Brien et al., *IEEE Photonics Technology Letters*, vol. 9, No. 9, Sep. 1997, pp. 1217–1219.

*Wavelength Conversion using Semiconductor Optical Amplifiers*, M. Asghari et al., *Journal of Lightwave Technology*, vol. 15, No. 7, Jul. 1997, pp. 1181–1190.

*Gain Dynamics of a Saturated Semiconductor Laser Amplifier with 1.47–μm LD Pumping*, K. Inoue et al., *IEEE Photonics Technology Letters*, vol. 8, No. 4, Apr. 1996, pp. 506–508.

*Improvement of Saturation Output Power in a Semiconductor Laser Amplifier through Pumping Light Injection*, M. Yoshino et al., IEEE Photonics Technology Letters, vol. 8, No. 1, Jan. 1996, pp. 58–59.

*Progress in Long–Wavelength Strained–Layer InGaAs(P) Quantum–Well Semiconductor Laser and Amplifiers*, P.J.A. Thijs et al., IEEE Journal of Quantum Electronics, vol. 30, No. 2, Feb. 1994, pp. 477–499.

*5.25–W CW Near–Diffraction–Limited Tapered–Stripe Semiconductor Optical Amplifier*, D. Mehuys et al., IEEE Photonics Technology Letters, vol. 5, No. 10, Oct. 1993, pp. 1179–1182.

*High–Power Diffraction–Limited Monolithic Broad Area Master Oscillator Power Amplifier*, S. O'Brien et al, IEEE Photonics Technology Letters, vol. 5, No. 5, May 1993, pp. 526–528.

*2.0 W CW, Diffraction–Limited Operation of a Monolithically Integrated Master Oscillator Power Amplifier*, R. Parke et al., IEEE Photonics Technology Letters, vol. 5, No. 3, Mar. 1993, pp. 297–300.

*Semiconductor Optical Amplifiers*, N. Anders Olsson, Proceedings of IEEE, vol. 80, No. 3, Mar. 1992, pp. 375–382.

*Ultra–Low–Reflectivity Semiconductor Optical Amplifiers without Antireflection coatings*, W. Rideout et al., Electronics Letters, vol. 26, No. 1, Jan. $4^{th}$ 1990, pp. 36–38.

*546 km, 140 Mbit/s FSK Coherent Transmission Experiment through 10 Cascaded Semiconductor Laser Amplifiers*, S. Ryu et al., Electronics Letters, vol. 25 No. 25, Dec. $7^{th}$ 1989, pp. 1682–1684.

*Pulse Energy Gain Saturation in Subpico– and Picosecond Pulse Amplification by a Traveling–Wave Semiconductor Laser Amplifier*, T. Saitoh et al., IEEE Photonics Technology Letters, vol. 1, No. 1, Oct. 1989, pp. 297–299.

*Polarization–Independent Optical Amplifier with Buried Facets*, N. A. Olsson et al., Electronic Letters, vol. 25, No. 16, Aug. 1989, pp. 1048–1049.

*Gain and Noise Characteristics of a 1.5µm near–travelling–wave Semiconductor Laser Amplifier*, J.–C. Simon et al., Electronic Letters, vol. 25, No. 7, Mar. 1989, pp. 434–436.

*1.3µm Semiconductor Laser Power Amplifier*, N. A. Olsson et al., IEEE Photonics Technology Letters, vol. 1, No. 1, Jan. 1989, pp. 2–3.

*Semiconductor Laser Optical Amplifiers for Use in Future Fiber Systems*, M. J. O'Mahoney, Journal of Lightwave Technology, vol. 6, No. 4, Apr. 1988, pp. 531–544.

*New Inline Wideband Dynamic Semiconductor Laser Amplifier Model*, A. J. Lowery, IEEE Proceedings, vol. 135, Pt. J. No. 3, Jun. 1988, pp. 242–250.

*Recent Progress in Semiconductor Laser Amplifiers*, Tadashi Saitoh et al., Journal of Lightwave Technology, vol. 6, No. 11, Nov. 1988, pp. 1656–1664.

*Fabrication and Performance of 1.5µm GaInAsP Travelling Wave Laser Amplifiers with Angled Facets*, C. E. Zah et al., Electronic Letters, vol. 23, No. 19, Sep. 1987, pp. 990–991.

*Travelling–wave Optical Amplifier at 1.3µm*, G. Eisenstein et al., Electronic Letters, vol. 23, No. 19, Sep. 1987, pp. 1019–1022.

*Optical FM Signal Amplification by Injection Locked and Resonant Type Semiconductor Laser Amplifiers*, Soichi Kobayashi et al., IEEE Transactions on Microwave Theory and Techniques, vol. MTT–30, No. 4, Apr. 1982, pp. 421–427.

*Efficient high power reliable InGaAs/A/GaAs (940nm) monolithic laser diode arrays*, X. He et al., Electronic Letters, vol. 35, No. 20, Sep. 1999, pp. 1739–1740.

*Effects of broad–waveguide structure in 0.8 µm high–power InGaAsP/InGaP/AiGaAs lasers*, T. Hayakawa et al., Applied Physics Letters, vol. 75, No. 13, Sep. 1999, pp.1839–1841.

*Very high power 1.48µm semiconductor lasers*, A. Mathur et al., Electronic Letters, vol. 35, No. 12, Jun. 1999, pp. 983–985.

*High–power and high temperature long–term stability of Al–free 950nm laser structures on GaAs*, G. Beister et al., Electronic Letters, vol. 35, No. 19, Sep. 1999, pp. 1641–1643.

*Ghost Modes and Resonant Effects in AlGaN–InGaN–GaN Lasers*, Petr G. Eilseev et al., IEEE Journal of Selected Topics in Quantum Electronics, vol. 5, No. 3, May/Jun. 1999, pp. 771–779.

*10.9W continuous wave optical power from 100µm aperture InGaAs/AlGaAs (915nm) laser diodes*, X. He et al., Electronic Letters, vol. 34, No. 22, Oct. 1998, pp. 2126–2127.

*High–power (>10 W) continuous–wave operation from 100–µm–aperature 0.97–µm–emitting Al–free diode lasers*, A. Al–Muhanna et al., Applied Physics Letters, vol. 73, No. 9, Aug. 1998, pp. 1182–1184.

*High–Power High–Efficiency 0.98–µm Wavelength InGaAs–(In)GaAs(P)–InGaP Broadened Waveguide Lasers Growth by Gas–Source Molecular Beam Epitaxy*, Milind R. Gokhale et al., IEEE Journal of Quantum Electronics, vol. 33, No. 12, Dec. 1997, pp. 2266–2276.

*9.3 W CW (In)AlGaAs 100µm wide lasers at 970nm*, S. O'Brien et al., Electronic Letters, vol. 33, No. 22, Oct. 1997, pp. 1869–1871.

66

*CW wallplug efficiency from Al–free 0.98µm–emitting diode lasers*, D. Bolez et al., Electronic Letters, vol. 32, No. 21, Oct. 1996, pp. 2012–2013.

*A Novel Cladding Structure for Semiconductor Quantum–Well Lasers with Small Beam Divergence and Low Threshold Current*, Shun–Tung Yen et al., IEEE Journal of Quantum Electronics, vol. 32, No. 9, Sep. 1996, pp. 1588–1595.

*InGaP/InGaAsP/GaAs 0.808 µm Separate Confinement Laser Diodes Grown by Metalorganic Chemical Vapor Deposition*, J. Diaz et al., IEEE Photonics Technology Letters, vol. 6, No. 2, Feb. 1994, pp. 132–134.

*Aluminum–Free 980–nm GaInAs/GaInAsP/GaInP Pump Lasers*, Harry Asonen et al., IEEE Journal of Quantum Electronics, vol. 30, No. 2, Feb. 1994, pp. 415–423.

*600 mW CW Single–Mode GaAlAs Triple–Quantum–Well Laser with a New Index Guided Structure*, Osamu Imafuji et al., IEEE Journal of Quantum Electronics, vol. 29, No. 6, Jun. 1993, pp. 1889–1894.

*Leaky wave room–temperature double heterostructure GaAs:GaAlAs diode laser*, D. R. Scifres et al., Applied Physics Letters, vol. 29, No. 1, Jul. 1976, pp. 23–25.

*Operating Characteristics of a High–Power Monolithically Integrated Flared Amplifier Master Oscillator Power Amplifier*, Stephen O'Brien et al., IEEE Journal of Quantum Electronics, vol. 29, No. 6, Jun. 1993, pp. 2052–2057.

*High–Power 1.3µm InGaAsP–InP Amplifiers with Tapered Gain Regions*, J.P. Donnelly et al., IEEE Photonics Technology Letters, vol. 8, No. 11, Nov. 1996, pp. 1450–1452.

*High–Power, Near–Diffraction–Limited Large–Area Traveling–Wave Semiconductor Amplifier*, Lew Goldberg et al., *IEEE Journal of Quantum Electronics*, vol. 29, No. 6, Jun. 1993, pp. 2028–2043.
*The carrier effects on the change of refractive index for n–type GaAs at λ=1.06, 1.3, and 1.55 μm*, H.C. Huang et al., *J. Appl. Phys.*, vol. 67, No. 3, Feb. 1, 1990, pp. 1497–1503.
*Monolithic Super–Bright Red Resonant Cavity Light–Emitting Diode Grown by Solid Source Molecular Beam Epitaxy*, Marko Jalonen et al., *IEEE Photonics Technology Letters*, vol. 10, No. 7, Jul. 1998, pp. 923–925.
*1.1W CW, Diffraction–Limited operation of a Monolithically Integrated Flared–Amplifier Master Oscillator Power Amplifier*, D.F. Welch et al, *Electronic Letters*, vol. 28, No. 21, Oct. 8, 1992, pp. 2011–2013.
*High–Power InGaAs/GaAs Singlemode Laser Diodes With Reactive–Ion–Etched Ridges*, S.S. Ou et al., *Electronic Letters*, vol. 28, No. 25, Dec. 3, 1992, pp. 2345–2346.
*Oxidized GaAs QW vertical–cavity lasers with 40* power conversion efficiency, B. Weigl et al., *Electronic Letters*, vol. 32, No. 19, Sep. 12, 1996, pp. 1784–1786.
*Depressed index cladding graded barrier separate confinement single quantum well heterostructure laser*, T.M. Cockerill et al., *Applied Physics Letters*, vol. 59, No. 21, Nov. 18, 1991, pp. 2694–2696.
*Linewidth Broadening Factor in Semiconductor Lasers–An Overview*, Marek Osinski et al., *IEEE Journal of Quantum Electronics*, vol. QE–23, No. 1, Jan. 1987, pp. 9–29.
*Nature of Wavelength Chirping in Directly Modulated Semiconductor Lasers*, T.L. Koch et al., *Electronic Letters*, 6$^{th}$ Dec. 1984, vol. 20, No. 25/26, pp. 1037–1039.
Handbook of Semiconductor Lasers and Photonic Integrated Circuits, Y. Suematsu et al., 1994, pp. 402–407.
Handbook of Semiconductor Lasers and Photonic Integrated Circuits, Y. Suematsu et al., 1994, pp. 402–407.
Handbook of Semiconductor Lasers and Photonic Integrated Circuits, Y. Suematsu et al., 1994, pp. 58–65
*Dynamics of the optical damage of output mirrors of ridge semiconductor lasers based on strained quantum–well heterostructures*, I.V. Akimova et al., *Quantum Electronics*, vol. 28, No. 7, 1998, pp. 629–632.

*Semiconductor lasers emitting at the 0.98 μm wavelength with radiation coupling–out through the substrate*, N.B. Zvonkov et al., *Kvantovaya Elektronika*, vol. 25, No. 7, 1998 pp. 622–624, translated by A. Tybulewicz in *Quantum Electronics*, vol. 28, No. 7, 1998, pp. 605–607.
ADC's Epitaxial Mirror on Facet Process Improves 980 nm Pump Laser Reliability, Tim Whitaker, *Compound Semiconductor*(5), Jul. 2000, pp. 631–633.
*GaN microdisk light emitting diodes*, S. X. Jin et al., *Applied Physics Letters*, vol. 76, No. 5, Jan. 31, 2000, pp. 631–633.
Improved characteristics of InGaN multiple–quantum–well light–emitting diode by GaN/AlGaN distributed Bragg reflector grown on sapphire, N. Nakada et al., *Applied Physics Letters*, vol. 76, No. 14, Apr. 3, 2000, pp. 1804–1806.
*Room–temperture operation at 333 nm of $AI_{o.o3}Ga_{0.97}N/Al_{0.25}Ga_{0.75}N$ quantum–well light–emitting diodes with Mg–doped superlattice layers*, A. Kinoshita et al, *Applied Physics Letters*, vol. 77, No. 2, Jul. 10, 2000, pp 175–177.
*Resonant–cavity InGaN quantum–well blue light–emitting diodes*, Y.–K. song et al., *Applied Physics Letters*, vol. 77, No. 12, Sep. 18, 2000, pp 1744–1746.
*Green electroluminescent (Ga, In, Ai) N LEDs grown on Si (111)*, S. Dalmasso et al., *Electronic Letters*, vol. 36, No. 20, Sep. 28, 2000, pp. 1728–1730.
*High–efficiency, low voltage resonant–cavity light–emitting diodes operating around 650 nm*, J.W. Gray et al., *Electronics Letters*, vol. 36, No. 20, May 26, 2000, pp. 1730–1731.
*Semiconductor Optical Amplifiers*, Jong–Ryeol Kim et al., *Compound Semiconductor* 6(2), Fiber Optics—Forum, Mar. 2000, pp. 46–48, 50.
Copending U.S. patent application No. 09/474,744 entitled "Injection Incoherent Emitter".
Copending U.S. patent application No. 09/899,589 entitled "Injection Incoherent Emitter".
Copending U.S. patent application No. 09/781,017 entitled "Semiconductor Injection Laser".
Abstract of Russian Patent RU 2133534 obtained from Delphion database (www.delphion.com).

* cited by examiner

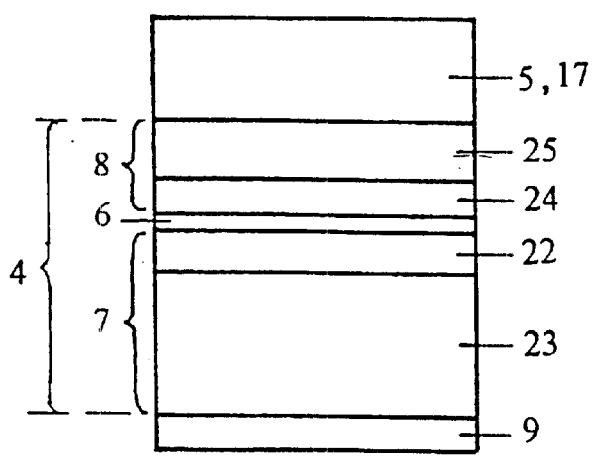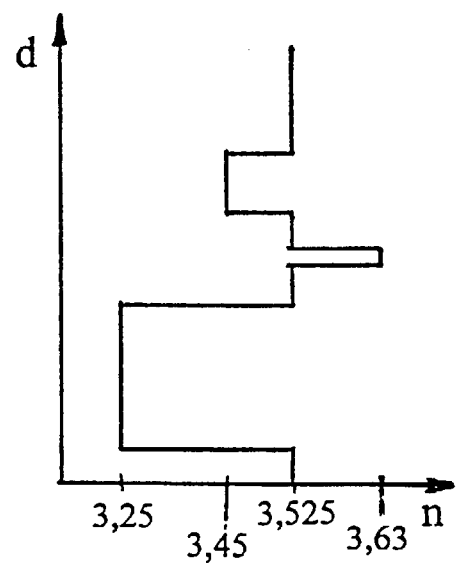
FIG.3              FIG.4
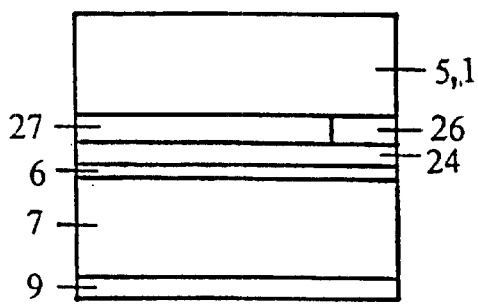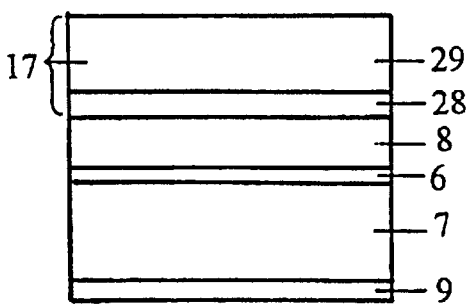
FIG.7              FIG.8
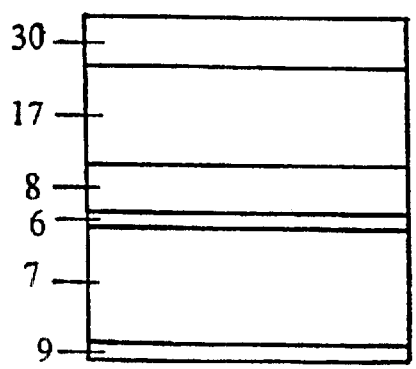
FIG.9

SEMICONDUCTOR OPTICAL AMPLIFIER

RELATED APPLICATIONS

This application is a continuation-in-part of International Application No. PCT/RU99/00067 filed in the Russian Receiving Office on Mar. 11, 1999. Applicants claim priority under 35 U.S.C. §120 to International Application No. PCT/RU99/00067 filed on Mar. 11, 1999 (now Russian Patent No. 2134007), which claims priority from Russian Patent Application No. 98103653, filed on Mar. 12, 1998.

FIELD OF THE INVENTION

The invention relates to quantum electronics, specifically to high-power multimode, monomode, and/or single-frequency radiation sources, and in particular to semiconductor optical amplifiers.

BACKGROUND OF THE INVENTION

Traditionally, a semiconductor optical amplifier (SOA) consists of a master source of input radiation whose output is optically coupled by an optical system to the input of an amplifying component (AC). See S. O'Brien et al., *IEEE J. of Quantum Electronics* (1993), Vol. 29, No. 6, pp. 2052–2057, and J. P. Donnelly et al., *IEEE Phot. and Technology Letters* (1996), Vol. 8, pp. 1450–1452). The optical signals usually are spontaneous, superluminescent, or laser radiation. By virtue of the specific features of a SOA, such as small size, high gain per unit length, high efficiency, potentially low cost, integrability into optoelectronic circuits, etc., the SOA unquestionably has great prospects for use both in the design of complex communications networks, particularly branched networks, and in the development of efficient high-power radiation sources.

An SOA in a discrete implementation is known that includes a master source of input radiation that is input, when the amplifier is in operation, at an input angle $\delta$ into an AC optically coupled to the source. See L. Goldberg et al., *IEEE J. of Quantum Electronics* (1993), Vol. 29, No. 6, pp. 2028–2042. The AC is implemented on the basis of a semiconductor laser heterostructure that contains an active layer with a refractive index $n_a$ and a bandgap $E_a$ (eV) positioned between two cladding layers, in each of which there is at least one sublayer. The active gain region is implemented by using barrier regions to form a mesa strip that widens linearly from its initial width $W_{in}$ of 10 $\mu$m at the input face of the active gain region, to a final width $W_{out}$ of 160 $\mu$m at the output face of the active gain region. The length $L_{AGR}$ of the SOA was 1500 $\mu$m. Note that the longitudinal axis of the active gain region, which lies in the active layer and is the optical gain axis of the AC, is located on the same optical axis as that of the master source and the optical system. The method of inputting the input radiation into the active gain region and of outputting radiation therefrom after amplification are via an optical facet on the input face of the active gain region and an optical facet on the output face of the active gain region. These optical facets are conditionally referred to as first optical facets and have antireflective coatings applied whose reflection coefficient, R, was in this case R~0.003. The first optical facets are positioned at angles of inclination $\psi_1$ and $\psi_2$ to the plane perpendicular to the optical gain axis, which is referred to as the normal plane. L. Goldberg et al., in *IEEE J. of Quantum Electronics* (1993), Vol. 29, No. 6, pp. 2028–2042, discloses a device wherein the first optical facets of the AC are parallel to the normal plane. The sizes of the input and output apertures for the AC discussed by L. Goldberg et al. in *IEEE J. of Quantum Electronics* (1993), Vol. 29, No. 6, pp. 2028–2042 are:

$$S_{in} = d_{AGR} W_{in}, \qquad (1)$$

and $$S_{out} = d_{AGR} W_{out}, \qquad (2)$$

respectively, where $d_{AGR}$ is the thickness of the active gain region, which usually does not exceed 1 $\mu$m. Accordingly, for the AC of the SOA disclosed by L. Goldberg et al. in *IEEE J. of Quantum Electronics* (1993), Vol. 29, No. 6, pp. 2028–2042, $S_{in}$ is no more than 10 $\mu$m$^2$ and $S_{out}$ is no more than 160 $\mu$m$^2$.

Antireflective coatings applied to the first optical facets of the active gain region are used as a means of suppressing spurious reflections and rereflections of the output signal (SPPI) in the AC shown by L. Goldberg et al. in *IEEE J. Of Quantum Electronics* (1993), Vol. 29, No. 6, pp. 2028–2042.

The SOA disclosed by L. Goldberg et al., *IEEE J. Of Quantum Electronics* (1993), Vol. 29, No. 6, pp. 2028–2042 uses as its master source of input radiation a master laser diode with monomode radiation and a power $P_{MSout}$ of 100 mW. The input radiation was focused by the optical system into a spot measuring 1×4 $\mu$m on the first (input) optical facet. In addition, the input beams were input into the active gain region at different input angles $\delta$. This resulted in the input into the amplifying component of an input power $P_{in}$ in the AC of 25 mW through the first face of the active gain region.

When an operating current $I_{work}$ of 3 A was passed through the AC with a length $L_{AGR}$ of 1500 $\mu$m that was disclosed by L. Goldberg et al., in *IEEE J. Of Quantum Electronics* (1993), Vol. 29, No. 6, pp. 2028–2042, 2.5 W of amplified output radiation power, $P_{out}$, was obtained. The input aperture was no larger than 1 $\mu$m. In the vertical plane, the angle of divergence $\theta_\perp$ as with the usual injection-type emitters, was large, i.e., approximately 35°. By vertical plane is meant a plane that passes through the longitudinal axis of the active layer and that is perpendicular to the layers of the laser heterostructure. The output aperture was small, i.e., no more than 1 $\mu$m. The effective angle of divergence $\theta_\parallel$ of the output radiation in the horizontal plane was 0.29°, which corresponds to the diffraction-limited divergence for the indicated aperture size of 160 $\mu$m. By horizontal plane is meant the plane that is perpendicular to the vertical plane and that passes through the normal of the amplified output radiation front is called horizontal plane. In the known AC in question, the horizontal plane corresponds to the plane of the active layer.

SUMMARY OF THE INVENTION

One preferred embodiment of the present invention comprises a semiconductor optical amplifier comprising a master source of input radiation and an amplifying component optically coupled to the master source. The amplifying component comprises a semiconductor heterostructure that includes an active layer positioned between two cladding layers and an ohmic contact formed to at least one sublayer of the semiconductor heterostructure. The amplifying component also includes an input-output region comprising at least one additional layer on at least one side of the heterostructure. This additional layer adjacent to the heterostructure comprises one or more sublayers having refractive indices $n_{IORq}$ and optical loss factors $\alpha_{IROq}$ (cm$^{-1}$), where q=1, 2, ..., p are integers corresponding to the sublayers of the radiation input-output region sequentially counted from their boundaries with the heterostructure, In the semiconductor optical amplifier, the input-output region is adapted to receive input radiation at an angle of input, δ. Additionally, the angle of the input radiation and the net loss factor $\alpha_{OR}$ (cm$^{-1}$) for the amplified radiation flowing from the active layer are such that $$0 < \arccos\frac{n_{\mathit{eff}}}{n_{IOR1}} \le \arccos\frac{n_{\mathit{eff\text{-}min}}}{n_{IOR1}}, \text{ and } n_{\mathit{eff\text{-}min}} > n_{\min},$$

where $n_{\mathit{eff}}$ is the effective refractive index of the heterostructure in aggregate with the radiation input-output region, and $N_{IOR1}$ is the refractive index of the radiation input-output region, $n_{\mathit{eff\text{-}min}}$ is the minimum value of $n_{\mathit{eff}}$ out of all possible $n_{\mathit{eff}}$ for the multiplicity of heterostructures that are of practical interest, in aggregate with radiation input-output regions, and $n_{\min}$ is the smallest of the refractive indices of the layers of the heterostructure.

BRIEF DESCRIPTION OF THE DRAWINGS

FIG. 3 schematically depicts a longitudinal cross-section of a laser heterostructure including a radiation input-output region and cladding layers each of which includes one sublayer with refractive indices corresponding to $n_{IOR}$.

FIG. 4 schematically depicts changes in refractive index in a direction perpendicular to the layers of the laser heterostructure depicted in FIG. 3.

FIGS. 7–9 schematically depict longitudinal sections of heterostructures in the amplifying component of the SOA;

FIG. 7 shows a sublayer of the cladding layer of the laser heterostructure that is adjacent to the radiation input-output region, wherein the sublayer comprises two regions with different values of refractive index;

FIG. 8 shows the radiation input-output region comprising two sublayers of different electrical conductivity; and FIG. 9 shows that a second additional absorption layer formed adjacent the radiation input-output region.

FIG. 10 shows an ohmic contact formed with an electrically conductive additional layer (the radiation input-output region, which is the substrate);

FIG. 11 shows an ohmic contact formed with an electrically conductive sublayer having a bandgap smaller than other sublayers of the cladding layer adjacent to the radiation input-output region; and FIG. 12 shows an ohmic contact with the electrically conductive sublayer of the radiation input-output region that is adjacent to the laser heterostructure.

FIG. 13 shows an AC with radiation input and output through second optical facets parallel to the normal plane;

FIG. 14 shows an AC with radiation input through a second optical facet parallel to the normal plane, and with radiation output through a second optical facet positioned at an acute angle to the plane of the active layer;

FIG. 15 shows an input-output region with second optical facets positioned at obtuse angles to the plane of the active layer and with radiation input and output through the outer surface of the radiation input-output region; and FIG. 16 shows an AC with radiation input and output through a second optical facet parallel to the normal plane, with a single reflection of amplified radiation in the radiation input-output region from the second optical facet.

FIG. 17 shows multibeam radiation output through outer surfaces of each subregion, the second optical facets of each subregion being positioned at obtuse angles to the plane of the active layer, except for the input surface, which is positioned at an acute angle; and FIG. 18 shows the second optical facets, which are positioned at acute angles to the plane of the active layer and which intersect at the boundary of the radiation input-output region with the laser heterostructure.

FIG. 21 shows a longitudinal cross-section of an SOA having amplifying active regions with superluminescent radiation placed on one side of the radiation input-output region;

FIG. 22 shows a longitudinal cross-section of an SOA with lasing and amplifying active regions positioned on one side of the radiation input-output region;

FIG. 23 shows a top view of an SOA with lasing and amplifying active regions positioned on one side of the radiation input-output region; and FIG. 24 shows a longitudinal cross-section of lasing and amplifying active regions positioned on opposite sides of the radiation input-output region.

DETAILED DESCRIPTION OF THE PREFERRED EMBODIMENT

Figure 1:
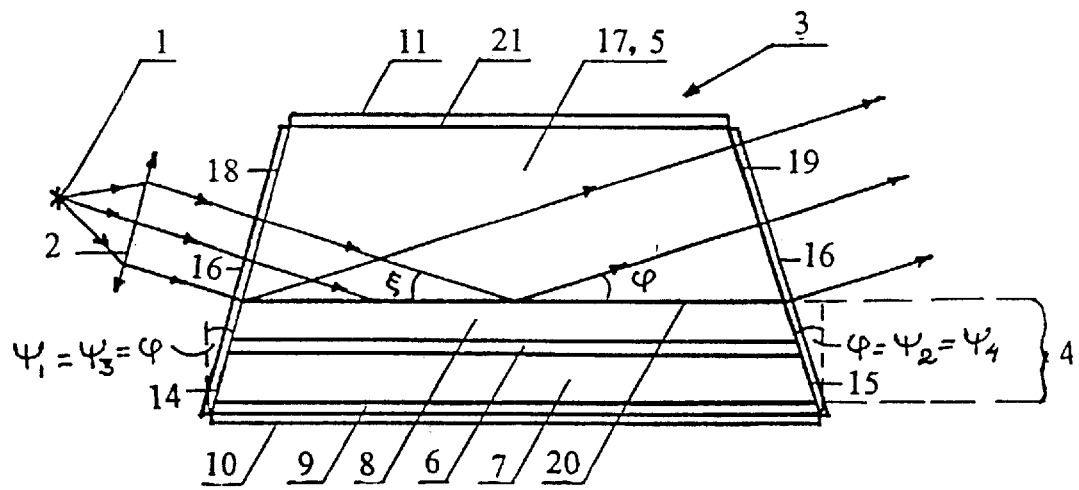
FIG. 1 schematically depicts a longitudinal cross-section of a semiconductor optical amplifier (SOA) comprising an amplifying component (AC) that is a preferred embodiment of the invention with radiation input and output through second optical facets positioned at acute angles to a plane parallel with an active layer, and with an ohmic contact formed to an outer surface of an optically homogeneous input-output region. This cross-section is taken along an optical gain axis in said active layer.

Embodiments of the invention will now be described with reference to the accompanying Figures, wherein like numerals refer to like elements throughout. The terminology used in the description presented herein is not intended to be interpreted in any limited or restrictive manner, simply because it is being utilized in conjunction with a detailed description of certain specific embodiments of the invention. Furthermore, embodiments of the invention may include several novel features, no single one of which is solely responsible for its desirable attributes or which is essential to practicing the inventions herein described.

Underlying the invention was the objective of creating a semiconductor optical amplifier (SOA) with increased areas of the input and output apertures, a reduced angle of divergence, and reduced astigmatism of the amplified output radiation, with the ability to obtain different directions of input and output of the amplified radiation relative to the optical gain axis in the active layer, and also with an increased effective gain-region length and increased resistance to the breakup mechanisms of the modal composition of the amplified input radiation. In the aggregate, the aforementioned factors result in the creation of a SOA with enhanced output power, efficiency, durability, and reliability, as well as high operational stability and steadiness. Simplification of the fabrication technology and the ability to implement a multibeam, multistage amplifier, as well of an amplifier in an integrated design, are thereby achieved.

In accordance with the invention, the stated objective is attained by virtue of the fact that in the semiconductor optical amplifier (SOA) including a master source of input radiation, and an amplifying component (AC) optically coupled to the source, the AC is implemented on the basis of a semiconductor laser heterostructure that contains an active layer, which is positioned between two cladding layers, in each of which there is at least one sublayer, ohmic contacts, the amplifying component being implemented with at least one active gain region and in it at least one additional layer is introduced on at least one side of the laser heterostructure, wherein the additional layer adjacent to the laser heterostructure is designated as the input-output region for radiation to which it is transparent, and is made of at least one sublayer; the sublayers having refractive indices $n_{IORq}$ and optical loss factors $\alpha_{IORq}$ (cm$^{-1}$), where q=1, 2, . . . , p are defined as integers, which denote the sequential numbers of sublayers of the radiation input-output region, as counted from its boundary with the laser heterostructure; in the working device the appropriate angle of input emission, $\delta$, and the net loss factor $\alpha_{OR}$ (cm$^{-1}$) for the amplified radiation emerging from the active layer are selected. The effective refractive index $n_{\it eff}$ of the laser heterostructure, along with the radiation input-output region, and the refractive index $n_{IOR1}$ of the radiation input-output region satisfies the relations:

$$0 < \arccos \frac{n_{\it eff}}{n_{IOR1}} \leq \arccos \frac{n_{\it eff\text{-}min}}{n_{IOR1}}, \text{ such that } n_{\it eff\text{-}min} \text{ is greater than } n_{min},$$

where $n_{\it eff\text{-}min}$ is the minimum value of $n_{\it eff}$ of all possible $n_{\it eff}$ for the multiplicity of laser heterostructures, in aggregate with radiation input-output region, that are of practical value, and $n_{min}$ is the smallest of the refractive indices of layers of the laser heterostructure.

The distinction of the proposed SOA consists in the construction of the means of radiation input to and output from the AC proper, and also of the master source in a number of embodiments of the SOA. Consequently, there is a change in the directivity of the input and output radiation's inside and outside the AC relative to the plane of the active layer. In contrast to the device described by L. Goldberg et al. (*IEEE J. Of Quantum Electronics* (1993), Vol. 29, No. 6, pp. 2028–2042), we propose that the means of input of the input signal and the means of output of the amplifier radiation be unified, integrating all semiconductive layers of the laser heterostructure and radiation input-output regions, with radiation input and output through the corresponding facets as conditionally referred to herein as second optical facets of the radiation input-output region (EIOR) forming angles $\psi_3$ and $\psi_4$ with the perpendicular plane as well as with the possible emission input through the facets conditionally referred to herein as first optical facets limiting from the end sides to the beginning and the end of the active region of amplification and forming slope angles $\psi_1$ and $\psi_2$.

Through the selection of the compositions and thicknesses of the semi-conductive layers of the laser heterostructure and of the composition of the radiation input-output region, such conditions are created that a specified portion of the input radiation from the master source, which is input into the radiation input-output region under the appropriate conditions, flows into the active gain region and, after corresponding amplification therein, flows back into the very same radiation input-output region.

The conditions of outflow are realized when the following relationship is fulfilled: the refractive index $n_{IOR}$ of the radiation input-output region exceeds the effective refractive index $n_{\it eff}$ of the entire heterostructure with the adjacent radiation input-output region, that is:

$$n_{IOR} > n_{\it eff}, \tag{3}$$

or, what is the same, the outflow angle $\phi$ exceeds zero, that is:

$$\phi = \arccos (n_{\it eff}/n_{IOR}) > 0. \tag{4}$$

Relation (3) is a known condition (see, e.g., the *Handbook of Semiconductor Lasers and Photonic Integrated Circuits*, edited by Y. Sucmatsu and A. R. Adams, Chapman-Hill, London, 1994, pp. 58–65) upon whose fulfillment part of the radiation propagated in the optical waveguide of the laser heterostructure will flow from the active layer.

For our case of a multilayer heterostructure, in the design we have chosen, we propose to use the principle, known in optics, of reversibility of the passage of rays in optical systems and hypothesized that universal condition (3) would be applicable not only for radiation outgoing into the radiation input-output region but also for radiation ingoing from the radiation input-output region. Further calculations and experiments confirmed the correctness of this hypothesis. The task at hand can be solved also by means of the fact that the input emission of the operating amplifier through the second optical facet of the radiation input-output region, may be collimated. Consequently, the angle of input, $\delta$, is equal to the angle of incidence of the collimated input emission to the surface of the input, unlike in the device of L. Goldberg et al. See, e.g., *IEEE J. Of Quantum Electronics* (1993), Vol. 29, No. 6, pp. 2028–2042. The angle of input, $\delta$, is determined based on the selection of the equation between the angle of inflow, $\xi$, and the angle of outflow, $\phi$, formed in the radiation input-output region, and consequently, by the perpendicular to the front of input inflowing emission and by the perpendicular to the front of the output amplified emission with the facet of the active layer of the heterostructure, where $\xi = \arccos (n_{\it eff}/n_{IOR})$. Accordingly, the following formula is correct:

$$\xi = \phi = \arccos (n_{\it eff}/n_{IOR}). \tag{5}$$

In this case, the input radiation from the radiation input-output region will be input into the active gain region of the proposed SOA and then, after the corresponding amplification therein, as stated previously, will flow back into the same radiation input-output region at an outflow angle $\phi$ (see relation (4)) to the plane of the active layer.

Conditions (4) and (5) determine the values of the refractive indices $n_{IOR}$, the inflow angle $\xi$, and the outflow angle $\phi$, which depend on the ratios $n_{\mathit{eff}}/n_{IOR}$, at the bottom end of the values. The top bound of the angles $\xi_{\mathit{front}}$ and $\phi_{\mathit{front}}$ is defined by the following relations proposed:

$$\arccos(n_{\mathit{eff}}/n_{IOR}) \leq \arccos(n_{\mathit{eff\text{-}min}}/n_{IOR}), \quad (6)$$

when $$n_{\mathit{eff\text{-}min}} > n_{\min}, \quad (7)$$

or $$\xi_{\mathit{front}} = \phi_{\mathit{front}} \leq \arccos(n_{\min}/n_{IOR}), \quad (8)$$

where $n_{\mathit{eff\text{-}min}}$ is the minimum value of $n_{\mathit{eff}}$ for the multiplicity of laser heterostructures that are of practical value, with radiation input-output regions from which ACs of the proposed SOA can be made, and $n_{\min}$ is the smallest of the refractive indices of the sublayers of the cladding layers. For real laser heterostructures the values of the angles $\xi_{\mathit{front}}$ and $\phi_{\mathit{front}}$ may be approximately 30–40°, and accordingly the range of the angles $\xi$ and $\phi$ varies over a range from greater than 0° to less than 30–40°.

Note that the presence of spectral dispersion, i.e., a dependence of $n_{\mathit{eff}}$ and $n_{IORI}$ on the wavelength of the input emission, leads to the possibility of the angle of outflow, $\phi$, which is governed by equations see (4) and (5), to vary depending on the spectral components of the input emission. The maximum variation of the angle $\phi$ may be within the range from $\phi - \Delta\phi/2$ to $\phi - \Delta\phi/2$, where $\Delta\phi$ is the angle of divergence of the out-flowing emission as determined by the complete width of the spectral band of amplification of the SOA. As a result of this fact and in accordance with (5), the maximum permissible deviation of the input angle of inflow $\xi$ from the angle $\phi$ is determined by the above range from $\phi - \Delta\phi/2$ to $\phi - \Delta\phi/2$.

Note that the aforementioned relations (3)–(8) are also valid for cases where the radiation input-output region consists of several sublayers. In this case, in the aforementioned formulae, the refractive index $n_{IOR}$ for a homogeneous radiation input-output region should be replaced with $n_{IOR1}$—refractive index for the first sublayer of the radiation input-output region that is adjacent to a sublayer of a cladding layer of the laser heterostructure. Hereinafter, unless otherwise stipulated, we shall consider the radiation input-output region to be homogeneous, and shall use $n_{IOR}$ without the subscript "1" for the first sublayer.

Only when the aforementioned features of the invention were fulfilled and when the radiation input-output region was transparent to ingoing and outgoing radiation did we obtain higher values of power and efficiency in the SOA with significantly larger effective radiation gain lengths than one usually obtains. The areas of the input and output apertures of the device also are significantly increased, the angles of divergence and astigmatism of the amplified output radiation are reduced, and, as a result of the distributed input and output of the amplified radiation along the entire active gain region, the ability of the SOA to withstand the mechanisms of breakup of the modal composition of the amplified input radiation is increased.

The task at hand can be solved also through the fact that the net loss factor, $\alpha_{OR}$, cm$^{-1}$, in the operating amplifier, for the amplified emission outflowing from the active layer at the border between the sub-layer of the cladding layer and the radiation input-output region, has been selected from a specific range of values. This range of values is bounded at the lower end of the range, $\alpha_{ORmin}$, cm$^{-1}$, by the minimum permissible value of the electrical power conversion efficiency supplied to the active region of amplification during operation of the amplifier, to the power of amplified emission. This range of values is also limited at the upper end of the range, $\alpha_{ORmax}$, cm$^{-1}$, by the maximum permissible value of the density of the current of operation. The increase in the permissible value of the operation current density j, A/cm$^2$, in the AC leads, for example, to impermissible overheating of the AC. In other words, in order to ensure high efficiency of operation of the proposed amplifier, it is recommended that the value of the net loss factor, $\alpha_{OR}$, cm$^{-1}$, of outflowing emission per unit of the length of the active region of amplification, be selected within the following range:

$$\alpha_{ORmin} < \alpha_{OR} < \alpha_{ORmax} \quad (9)$$

It is advisable to introduce barrier regions in the various versions and to make the amplification element with at least one active region of amplification, with length $L_{AGR}$, μm, width $W_{in}$, μm, at its beginning, and width $W_{out}$, μm, at its end. The first optical facets at the ends restrict the beginning and the end of the active region of amplification and form slope angles, $\psi_1$, and $\psi_2$ with the perpendicular plane, i.e., with the plane perpendicular to the longitudinal axis of the active layer.

In addition, in order to remove undesirable losses of injected current carriers, the amplification input-output region must be made with a width no lesser than the width of the active region of amplification. Additionally, the surface of the emission input-output region that borders the heterostructure and herein referred to as the inner surface must be made with a length $L_{IOR\text{-}1}$, μm, that is no lesser than the length $L_{ARG}$, μm.

The stated objective also is attained by virtue of the fact that the width $W_{in}$ (μm) of the active gain region is selected equal to the width $W_{out}$ (μm). Here, simplification of the fabrication technology for the device is achieved, as is, in contrast to ordinary SOAs, a sharp decrease in losses of injection currents in the unsaturated gain region on the input-radiation side. If the $W_{out}$ of the active gain region is selected to be larger than $W_{in}$, a decrease in the diffraction-limited divergence of the output radiation is obtained in the plane parallel to the layers of the laser heterostructure.

Furthermore, we propose that the radiation input-output region be made of an optically homogeneous material with a spectral band of transparency to the wavelength $\lambda$ (μm) of the radiation being amplified when the device is in operation.

The aforementioned requirement stems from the fact that when the ingoing and outgoing radiation's propagate in the sublayers of the radiation input-output region, the optical losses of these radiations (to absorption and scattering) therein must be small, and specifically, the optical loss factor $\alpha_{IORq}$ must be:

$$\alpha_{IORq} << 1/L_{IOR}, \quad (10)$$

where $L_{IOR}$ is the maximum of the lengths $L_{IOR\text{-}1}$ and $L_{IOR\text{-}O}$ for the radiation input-output region.

Obviously, to satisfy relation (10), it is essential first of all that the sublayers of the radiation input-output region be optically homogeneous, and that the bandgap $E_{IORq}$ of sublayers of the radiation input-output region be larger than the bandgap $E_a$ of the active layer, which determines the spectral gain band of the SOA. Absorption losses decrease roughly exponentially as a function of the difference between $E_{IORq}$ and $E_a$. Therefore, making the radiation input-output region from materials for which the wavelength λ (μm) falls within their transparency region results in a reduction of the optical losses $\alpha_{IORq}$ (cm$^{-1}$) and, hence in the attainment of one of the objective of this invention—an increase in the effective length of the radiation input-output region.

In the preferred embodiments of the device, the radiation input-output region may be made of a semiconductor with a bandgap $E_{IOR1}$ (eV) more than 0.09 eV larger than $E_a$ (eV), the width of the band gap for the active layer.

In this case, if the concentration of carriers in the radiation input-output region does not exceed $1 \times 10^{18}$ cm$^{-3}$, the optical loss factor $\alpha_{IOR-abs}$ for absorption may reach values on the order of 0.1 cm$^{-1}$ or less.

Note that in the general case the radiation input-output region may be made of not only semiconductive materials. It is only necessary that its characteristics, in particular the refractive index $n_{IOR}$ and optical loss factor $\alpha_{IOR}$ for absorption and scattering, meet the necessary requirements (3) and (10).

Furthermore, we propose that the thickness $d_{IOR}$ of the radiation input-output region be selected from the range 5–50,000 μm. Here, the choice of the thickness $d_{IOR}$ depends on the outflow angle φ, the length $L_{AGR}$, and the angles of inclination of the second optical facets in the AC. Naturally, the width $W_{IOR}$ of the radiation input-output region must not be smaller than the width of the active gain region along the entire length of the AC.

In the preferred cases the median plane of the active layer should be placed at a distance from the inner surface of the additional layer such that the intensity of the amplified radiation in the aforementioned median plane of the active layer that arises when the amplifier operates differs by no more than 20% from the maximum value.

This proposal is implemented by tailoring the composition (the refractive indices and absorption coefficients of the layers) and thicknesses of the layers of the laser heterostructure and the radiation input-output region. This leads to optimization of the operation of the AC, an increase in the gain for input radiation in the active layer, and consequently an increase in the efficiency and power of the output radiation.

In a number of cases, at least one of the sublayers of the cladding layers of the laser heterostructure is made to have a refractive index no lower than $n_{IOR1}$.

This makes it possible to effect a controlled decrease in the values of the outflow angle φ (see relation (4)) of radiation and the related inflow angle ξ (see relation (5)), in the direction of a decrease in them. It is desirable that the inflow angle ξ and the outflow angle φ have small values—for example, for the purpose of building the proposed SOAs with a large gain length $L_{AGR}$ but a limited thickness $d_{IOR}$.

It also is possible to make the layer of the laser heterostructure that adjoins the radiation input-output region having at least two regions introduced therein whose bordering surfaces are perpendicular to the plane of the active layer. In this case, either the refractive indices or the thicknesses of the neighboring regions of the sublayer are chosen to be different.

The region with the smaller thickness and/or larger refractive indices should be placed in direct proximity to the first optical facet. In this case the intensity of the outgoing radiation increases significantly in the indicated region, leading to a significant decrease in the intensity of the amplified radiation on the face of the active gain region, and hence to a corresponding decrease in the amount of spurious radiation reflected. Note that the aforementioned additional decrease in the intensity of the amplified radiation on the first optical facet will make it possible to increase the operating life and operational reliability of the device.

Furthermore, we propose that the outer additional layer be made of a material that absorbs the radiation being amplified. The purpose of this layer is to ensure that maximum absorption of possible spurious reflections and rereflections of amplified radiation, as for example through strong interband absorption, occurs in the layer. This results in more effective suppression of spurious radiations, and hence in the stabilization of the gain mode of the proposed SOA to high values of the amplified output power.

In the preferred cases, the radiation input-output region should be made electrically conductive, and if other additional layers are present, they too should be made electrically conductive. Here, an ohmic contact is formed with the surface of the electrically conductive radiation input-output region and, if other additional layers are present, an ohmic contact is formed with the free surface of the additional layers.

In a number of cases it is advisable to make the radiation input-output region from a material with an optical loss factor $\alpha_{IORq}$ of no more than 0.1 cm$^{-1}$.

In some cases it is advisable to form the radiation input-output region from two sublayers; here, the first sublayer bordering the laser heterostructure must be electrically conductive, and the second sublayer must be made of a material with an optical loss factor $\alpha_{IOR2}$ of no more than 0.1 cm$^{-1}$. Here, an ohmic contact is made with the first sublayer of the radiation input-output region.

The low values of $\alpha_{IORq}$ result in a corresponding increase (see relation (10)) in the effective length of the amplifier, and consequently in its output power and efficiency. If the second sublayer is not electrically conductive, then this brings about lower values for the factor $\alpha_{IOR2}$. If the value of the refractive index $n_{IOR2}$ is smaller for the second sublayer than for the first one, this leads to a decrease in the outflow angle φ as radiation propagates in the second sublayer, and consequently to a decrease in the total thickness of the radiation input-output region. Furthermore, this makes it possible to make second optical facets parallel to the normal plane, which results in the simplification of the fabrication technology for the product and in an increase in the effective length of the SOA and accordingly in its output power and efficiency.

In some cases an ohmic contact from the direction of the radiation input-output region can be formed with one of the electrically conductive sublayers of the cladding layer located between the active layer and the radiation input-output region. It is advisable that an ohmic contact be made with the electrically conductive layer that has the smallest value of the bandgap.

The proposed modifications for making ohmic contacts result in the simplification of the fabrication technology for the SOA.

The object that we posed is also attained by virtue of the fact that we propose different designs of the radiation input-output region. These designs use laser heterostructures with the fullest possible ranges of inflow angles ξ and outflow angles φ, as determined by relations (4)–(8). Furthermore, we propose radiation input-output regions with different angles of inclination ψ of the second optical facets, from the directions of both radiation input and output. (We stipulated that the angle of inclination of the optical facet is to be obtuse or acute, depending on what angle the optical facet subtends with the inner surface of the radiation input-output region.) What is proposed makes it possible to build a SOA with greater efficiency, output power, durability, and reliability, larger input and output apertures, and reduced angles of divergence of the output radiation for different directions of input and output of the amplified radiation, while simplifying the fabrication technology.

To effect radiation input through a second optical facet introduced to the radiation input-output region at the end of its input with an anti-reflective coating introduced therein which is made parallel to the normal plane, the input angles δ is made to satisfy the condition arcsin ($n_{IORq}$ sinξ).

To effect radiation input through the outer surface of the radiation input-output region, the antireflective coating is formed on the part of the surface of the radiation input-output region that is determined by the size of the input aperture and that faces its inner surface and abuts on the second optical facet from the direction of radiation input, which forms an obtuse angle with the plane of the active layer and which is formed at an angle of inclination $\psi_3$ selected from the range:

$[(\pi/4)-(\xi/2)-(\sigma/2)]$ to $[(\pi/4)-(\xi/2)+(\sigma/2)]$.

where σ is the angle of total internal reflection for the omission flowing out in the input-output emission region. If the input radiation is directed normally to the input surface, the angle of inclination $\psi_3$ is selected to be $[(\pi/4)-(\xi/2)]$.

To effect radiation input through a second optical facet introduced in the input-output emission region at the output end with an antireflective coating that subtends an acute angle with the plane of the active layer, it is made at an angle of inclination $\psi_3$ selected from the range:

(ξ−σ) to (ξ+σ).

If while the amplifier is in operation the input radiation is directed normally to the aforementioned optical facet, then the angle of inclination $\psi_3$ is selected to be equal to the inflow angle ξ.

To effect radiation input through a second optical facet with an anti-reflective coating that subtends an acute angle with the plane of the active layer, it is made with an angle of inclination $\psi_4$ selected from the range:

(φ−σ) to (φ+σ).

To obtain output radiation directed normally to the output surface while the amplifier is in operation, the angle of inclination $\psi_4$ is selected equal to the outflow angle φ.

To effect radiation output through a second optical facet with an anti-reflective coating made parallel to the normal plane, the outflow angle φ is selected to be smaller than the angle of total internal reflection σ from the aforementioned surface.

To effect radiation input and output through one and the same second optical facet, we propose that a reflective coating be made on one of the second optical facets, and that it be formed parallel to the normal plane, and that an introduced antireflective coating be made on the other, opposite second optical facet; here, radiation input is provided for through one part of this surface, which is determined by the size of the input aperture and which is located, beginning with the boundary of the second optical facet with the inner surface of the radiation input-output region, at a distance of no more than $L_{AGR}$·tan φ, and radiation output is provided for through the same surface in a different part of it. In this particular case, we propose that a reflective coating be applied to the first optical facet adjacent to the second optical facet with the reflective coating, in order to increase the output power.

In such two-pass SOAs that is being proposed by us, the input and output of the amplified radiation are spatially separated directly on the second optical facet.

To effect radiation output through the surface of the input-output region opposite the inner surface, the antireflective coating is made on a part of the surface, as determined by the size of the output aperture, of the radiation input-output region, which is opposite the inner surface of the latter and adjacent to the second optical facet from the direction of radiation output and which subtends an obtuse angle with the plane of the active layer and is formed at an angle of inclination $\psi_4$ selected to be in the range:

$[(\pi/4)-(\phi/2)-(\sigma/2)]$ to $[(\pi/4)-(\phi/2)+(\sigma/2)]$.

For output in which the output radiation is directed normally to the output surface, the angle of inclination $\psi_4$ is selected to be $[(\pi/4)-(\phi/2)]$.

To obtain a multibeam SOA, we propose that the radiation input-output region be made of at least two introduced subregions, the first of which is optically coupled to the master source, and the subregions are separated by second optical facets for radiation output from each subregion while the amplifier is in operation. The inclination of the faces forming the subregions may differ from the inclination of the second optical facet in the direction of radiation input. It is possible in this case to select different combinations of the angle of inclination $\psi_3$ and $\psi_4$ to effect radiation output, including such output normally to the plane of the active layer.

For example, to output radiation through the surface of the laser heterostructure opposite the position of the radiation input-output region, we propose that second optical facets in the direction of radiation output, subtending an acute angle with the plane of the active layer, be formed at an angle of inclination $\psi_4$ selected in the range:

$[(\pi/4)+(\phi/2)-(\sigma/2)]$ to $[(\pi/4)+(\phi/2)+(\sigma/2)]$, and that antireflective coatings be made in the areas of their projections on the surface of the laser heterostructure opposite the position of the radiation input-output region.

To build a SOA with a multistage AC, we propose that at least two active gain regions with an identical inflow angle ξ and outflow angle φ for each gain region be formed on the surface of the radiation input-output region, or that at least two active gain regions be formed along a single line parallel to the surface of the radiation input-output region and to the plane of the active layer, with a spacing of $2d_{IOR}$/tan φ between the starts of the active regions, or that at least one active gain region with an identical inflow angle ξ and outflow angle φ for each gain region be formed on opposite surfaces of the radiation input-output region, or that at least one active gain region be formed along each of two lines that are parallel to each other and that are on opposite surfaces, with a shortest distance $d_{IOR}$/sin φ between the starts of the active gain regions on opposite sides.

We also propose SOAs in both a discrete embodiment and an integrated embodiment, including the use of a nonstandard master source of input radiation, including a multistage AC.

In the discrete embodiment, we propose that the master source of input radiation be formed as a second amplifying component (AC). In this case the SOA is a source of superluminescent radiation with high directivity.

In the same discrete embodiment of the SOA, we propose that reflectors be incorporated in the active gain region of the second amplifying component. In this case the SOA is a source of highly directional laser radiation.

To obtain a SOA in the integrated embodiment with superluminescent radiation, we propose that the active gain region of the master source be placed in the radiation input-output region of the amplifying component so that the outflow angle φ of the active gain region of the master source is identical to the inflow angle ξ of the active gain region of the amplifying component.

To obtain a SOA in the integrated embodiment with laser radiation, we propose that reflectors be incorporated in the active gain region of the master source.

The amplified output radiation of such SOAs is distinguished by high output power with small angles of divergence in both the vertical and horizontal planes at low astigmatism.

The following modifications are proposed for the integrated embodiment:
  the active regions of the master source and amplifying component are on the same inner surface of the radiation input-output region;
  the active gain regions of the master source and amplifying component are on the same line parallel to the surface of the radiation input-output region and to the plane of the active layer, with a spacing $2d_{IOR}/\tan\phi$ between the starts of the active regions;
  the active gain regions of the master source and amplifying component are disposed on opposite surfaces of the radiation input-output region; and
  the active gain regions of the master source and amplifying component are formed along each of two lines that are parallel to each other and that are on opposite surfaces, the shortest distance between the starts of the active gain regions on opposite surfaces being $d_{IOR}/\sin\phi$.

For SOAs with a multistage AC, for both the discrete and the integrated embodiments, we propose that at least part of at least one surface of the radiation input-output region be made reflective.

By virtue of total internal reflection of radiation from the aforementioned reflective surfaces, those surfaces perform optical coupling between the active gain regions in the radiation input-output region common to them.

For SOAs with laser radiation in both discrete and integrated designs that are distinguished by different kinds of feedback, we propose that the reflectors of the active gain region of the second amplifying component—the master laser—and the reflectors of the active gain region of the AC be made, for example, in the form of:
  reflective coatings, or
  distributed Bragg reflectors, or
  distributed feedback reflectors along the entire length of the active gain region of the master source.

The essence of the present invention is a new, nonobvious proposal for distributed input of collimated input radiation into the amplifying component, and for distributed output of the amplified, diffraction-limited radiation with a small angle of divergence from the amplifying component. In the proposed SOAs the input of the input signal, like the output of the amplified radiation, occurs simultaneously along the entire length of the amplifying component, which is equal to the length of the active gain region, which is several times greater than its thickness. This is attained by virtue of the nonobvious aggregate of all the essential features, including the input of input radiation by using a collimated beam incident at specified angles on the input surface from the master source, the incorporation in the amplifying component of the SOA of the new, nonobvious means of radiation input being proposed by us, which is originally combined into a unified (integrated) means of input/output that includes the entire laser heterostructure and an additionally introduced region of radiation input/output bounded on the end faces by additionally introduced second optical facets, and a set of original, nonobvious requirements formulated by us for the characteristics of the laser heterostructure used, the material of the input-output region itself, and the inclination of its optical facets.

The essence of the present invention is also the new SOA designs proposed, with multibeam radiation output and a multistage amplifying component, in an integrated embodiment with a master source of input superluminescent or laser radiation in the form of an analogous amplifying component.

When compared with the SOAs currently in use, including the device described by L. Goldberg et al. (*IEEE J. of Quantum Electronics* (1993), Vol. 29, No. 6, pp. 2028–2042), the advantages of the proposed SOAs are as follow.

The areas of the input and output apertures have been increased because of the increase in the size of the aforementioned apertures in the vertical plane. In comparison with the prior art, the aforementioned increase, which is defined by the ratio $d_{IOR}/d_{AGR}$, may amount to a factor of hundreds, thousands, or more.

The increase in the area of the input aperture allows not only for a reduction of losses of the input signal when it is fed into the active region and, accordingly, for the input of higher input power into the AC and an increase in the its input efficiency, which is important for building high-efficiency, powerful SOAs and high-sensitivity optical preamplifiers, but also allows for a significant simplification of the labor-intensive precision process of injecting the input radiation directly into the active gain region.

The increase in the area of the output aperture makes possible a decrease in the angle of divergence $\theta_\perp$ in the vertical plane of the amplified diffraction-limited output radiation, a reduction of its astigmatism, and a significant decrease (by a factor of approximately $d_{IOR}/d_{AGR}$) in the intensity of the amplified output radiation on the second optical facet during extraction from the SOA 3. At the same time, in comparison with the design of the prior art 3, the radiation intensity on the first optical facet has been reduced on the side where the radiation is extracted.

The SOA designs proposed by us make possible not only the realization of different directions of radiation input into and output from the radiation input-output region, but also the expansion of the range of SOAs with large values of the outflow angles φ that are distinguished by higher efficiency and larger input and output apertures.

The decrease in the intensities of output radiation on the first and second optical facets on the radiation-output side makes it possible to obtain high levels of output radiation power, without approaching, as is the case in the prior art, the extreme breakup intensities; this makes it possible to assure increased operating life and reliability of the proposed SOAs, even at high power levels.

The corresponding selection of the values of $\alpha_{MS}$, $\alpha_{AGR}$, and $\alpha_{IOR}$ makes possible a significant increase in the effective gain length of the device, and thus an increase in the volume of the active gain region, and consequently an increase in the efficiency and output power of high-quality laser radiation with diffraction-limited divergence in two mutually perpendicular planes.

Increasing the effective length makes it possible to realize the promising designs being proposed by us for multibeam SOAs and SOAs with a master source of input radiation in the form of an amplifying component and with a multistage amplifier, including those with an integrated embodiment.

Another important advantage of the proposed SOAs is their high operational stability and steadiness at high output-radiation levels, which are determined by the proposed fundamentally new mechanism of distributed radiation input-output [to-]from the active gain region.

Let us draw attention to the fact that the technical implementation of the proposed SOA is based on known basic production processes, which by now have been worked out quite well and are used extensively in the fabrication of typical SOAs.

The proposed SOA schematically depicted in FIG. 1 comprises a master source 1 and an optical system 2 for forming the input radiation, which are positioned on the same optical axis, and an AC 3, the longitudinal axis of whose active region is not an extension of the optical axis of the first two elements. AC 3 is implemented as a semiconductor laser heterostructure 4 positioned on a substrate 5 and comprising an active layer 6, cladding layers 7 and 8, which are on both sides of active layer 6, and a contact layer 9 on cladding layer 7. Cladding layer 8 is positioned on substrate 5. The highly doped contact layer 9 (a p-type design in the example in question) is intended to make an ohmic contact 10 with the cladding layer 7. A second ohmic contact 11 is made with substrate 5 on its outer surface (see FIG. 10).

Figure 2:
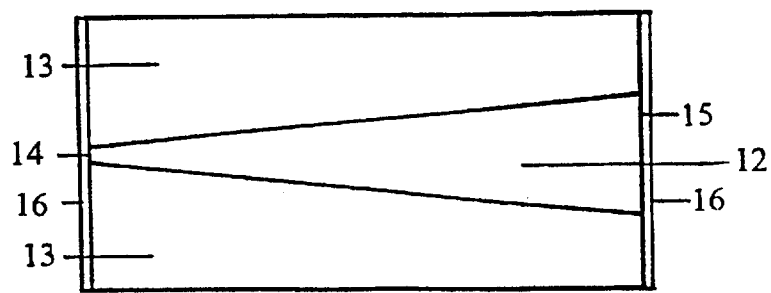
FIG. 2 gives a top view of an amplifying component within the semiconductor optical amplifier shown in FIG. 1.

The active gain region (see FIG. 2) is implemented by forming a mesa strip 12 by means of barrier regions 13. In this modification the configuration of the active gain region has been selected to be expandable, as schematically illustrated in FIG. 2. The width $W_{in}$ at the input has been selected to be 10 $\mu$m, and at the output $W_{out}$ is 160 $\mu$m. The optical facet 14 of the input face of the active gain region and the optical facet 15 of the output face of the active gain region, which we conditionally call first optical facets 14 and 15, with antireflective coatings 16 applied to them. In the case in question, the latter have reflection coefficients of 0.001, and substrate 5 is the radiation input-output region 17.

On the radiation input and output side, radiation input-output region 17 is bounded by second optical facets 18 and 19, to which antireflective coatings 16 with a reflection coefficient of 0.001 for input and output radiation were also applied. In the design corresponding to that schematically depicted in FIG. 1, the first optical facets 14 and 15 and second optical facets 18 and 19 subtend an acute angle with the plane of active layer 6, and are directed at corresponding angles of inclination to the normal plane: $\psi_1$ and $\psi_2$, which are equal to $\xi$, and $\psi_3$ and $\psi_4$, which are equal to $\phi$; here, the angle $\xi$ is equal to the angle $\phi$ and has a value of 9°30'. The permissible deviation of the angle $\xi$ from the angle $\phi$ did not exceed the calculated value of the dispersion divergence angle, $\Delta\phi$, for outflowing emission equal to 1°. The adjustment of the angle $\xi$ was achieved through the alignment of the angle of incidence, $\delta$, of the input emission to the second optical facet 18 radiation input-output region 17. The inner surface 20 of radiation input-output region 17 borders on cladding layer 8 and has a length $L_{IOR-I}$ along the radiation gain axis of at least length $L_{AGR}$. For the given design, the indicated lengths are practically equal, and the outer surface 21 of radiation input-output region 17 has a length $L_{IOR-O}$ shorter than the length $L_{IOR-I}$. The length $L_{IOR-O}$ of the proposed SOA is practically equal to the length $L_{AGR}$, which is 1500 $\mu$m. The thickness $d_{IOR}$ of radiation input-output region 17 was selected to be 260 $\mu$m.

Figure 5:
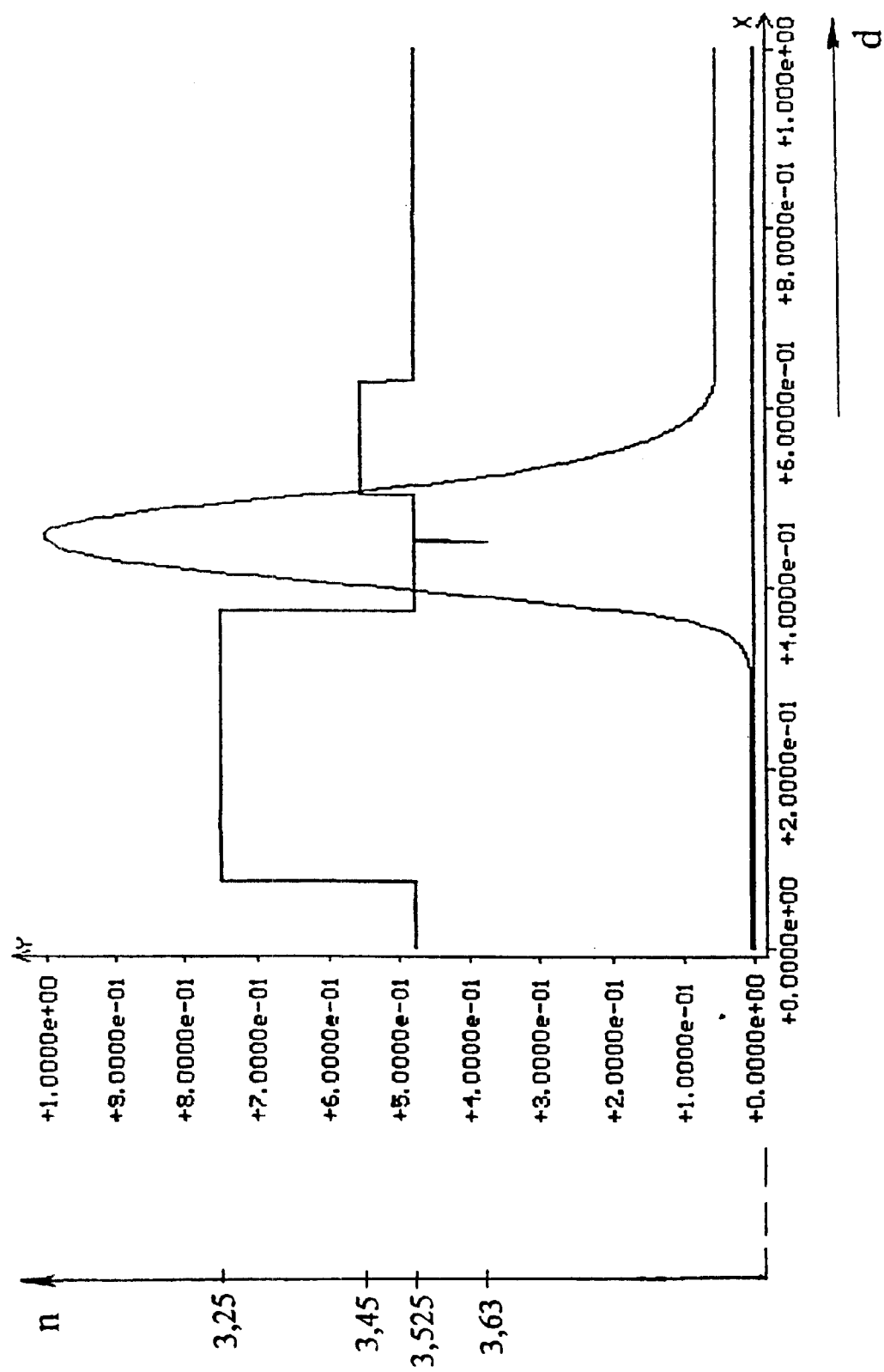
FIG. 5, on axes of longitudinal distance (arbitrary units) versus intensity (arbitrary units) and index of refraction, plots calculated data corresponding to a distribution of near-field intensity of the amplified radiation and change in the refractive indices superposed thereon for the layers of the laser heterostructure shown in FIGS. 3 and 4.

The longitudinal section of AC 3 (see FIG. 1) depicts the sequence of optically homogeneous layers and sublayers of a laser heterostructure with one optically homogeneous subregion of radiation input-output region 17 and a contact layer 9. Cladding layer 7 consists of two sublayers, 22 and 23, active layer 6 consists of one sublayer, and cladding layer 8 consists of two sublayers 24 and 25; layer 25 adjoins radiation input-output region 17 (see Table 1). To create the design in question, the semiconductor layers were grown by the known MOCVD method on substrate 5 from electrically conductive gallium arsenide, which acts as radiation input-output region 17. The composition, thicknesses, refractive indices, type and concentrations of doping, and the corresponding absorption coefficients of the layers of heterostructure 4 of radiation input-output region 17 are presented in Table 1 and also in FIGS. 4 and 5. The wavelength $\lambda$ ($\mu$m) of the amplified radiation was chosen to lie within the gain band, which is determined by the composition of active layer 6 and has a size of 0.980 $\mu$m.

When the proposed SOA is connected to a power source, nonequilibrium carriers, which effect in the AC 3, as in the AC of the known SOA (see the device of L. Goldberg et al., IEEE J. Of Quantum Electronics (1993), Vol. 29, No. 6, pp. 2028–2042), amplification of the input radiation of wavelength $\lambda$ ($\mu$m), or of wavelengths within the gain band of the device, that is input into the active region are injected into active layer 6 of AC 3.

Twenty-five milliwatts of input radiation collimated in the vertical plane was incident on the second optical facet 18, with an input area $S_{in}$ of 2,475 $\mu m_2$ (247.5 $\mu$m, the vertical extent of input, multiplied by 10 $\mu$m, the horizontal extent of input).

The standard lines with arrows show the directions of the collimated input radiation from master source 1 with an input angles $\delta$ to second optical facet 18 and of diffraction-limited amplified output radiation with a refractive index $\epsilon$ to second optical facet 19. For the design in question (see FIG. 1), when the device is in operation radiation input and output occur along normals to the corresponding second optical facets. The same method is used to indicate the direction of ingoing radiation into laser heterostructure 4 at an inflow angle $\xi$, and of outgoing radiation from laser heterostructure 4 at an outflow angle $\phi$ within radiation input-output region 17.

The basic parameters for both the heterostructure and the SOA in the example in question were obtained by a numerical simulation performed according to a program especially developed by us, underlying which is the matrix method (J. Chilwall and I. Hodkinson, Journ. Opt. Soc. Amer., A (1984), Vol. 1, No. 7, pp. 742–753) of solving Maxwell's equations with the corresponding boundary conditions in multilayer laser heterostructures.

These calculations used the following initial data:

$g_0$=200 cm$^{-1}$ —the material gain in active layer 6 that is needed to achieve inversion;

$\mu$=5×10$^{-16}$ cm$^2$ —a proportionality factor between (g+g$_0$) (cm$^{-1}$) and the injected-electron concentration $N_e$ (cm$^{-3}$), where g (cm$^{-1}$) is the material gain in the active layer;

$\tau$=1 nsec is the lifetime of nonequilibrium electrons in the active layer;

$\alpha_{AGR}$=5 cm$^{-1}$ is the optical loss factor for absorption and scattering of the amplified radiation in the active gain region;

$\alpha_{IOR}$=0.001 cm$^{-1}$—the optical loss factor in radiation input-output region 17; this value was taken for radiation input-output region 17 of gallium arsenide from (H. C. Huang et al., *Journ. Appl. Phys.* (1990), Vol. 67, No. 3, pp. 1497–1503) for a wavelength λ=0.98 μm and a carrier (electron) concentration of 1×10$^{18}$ cm$^{-3}$; and $α_{15}$=15 cm$^{-1}$—the loss factor for radiation emerging at the end of the active gain region through first optical facet 15.

Possible losses and distortions of the radiation fronts in radiation input-output region 17 due to radiation scattering were not taken into account in the calculations—radiation input-output region 17 was assumed to be optically homogeneous.

The assumed values of the parameters are typical of the InGaAs/GaAs/AlGaAs-based laser heterostructure 4 in question. If a laser heterostructure 4 using different connections is employed instead, these parameters may change.

Figure 6:
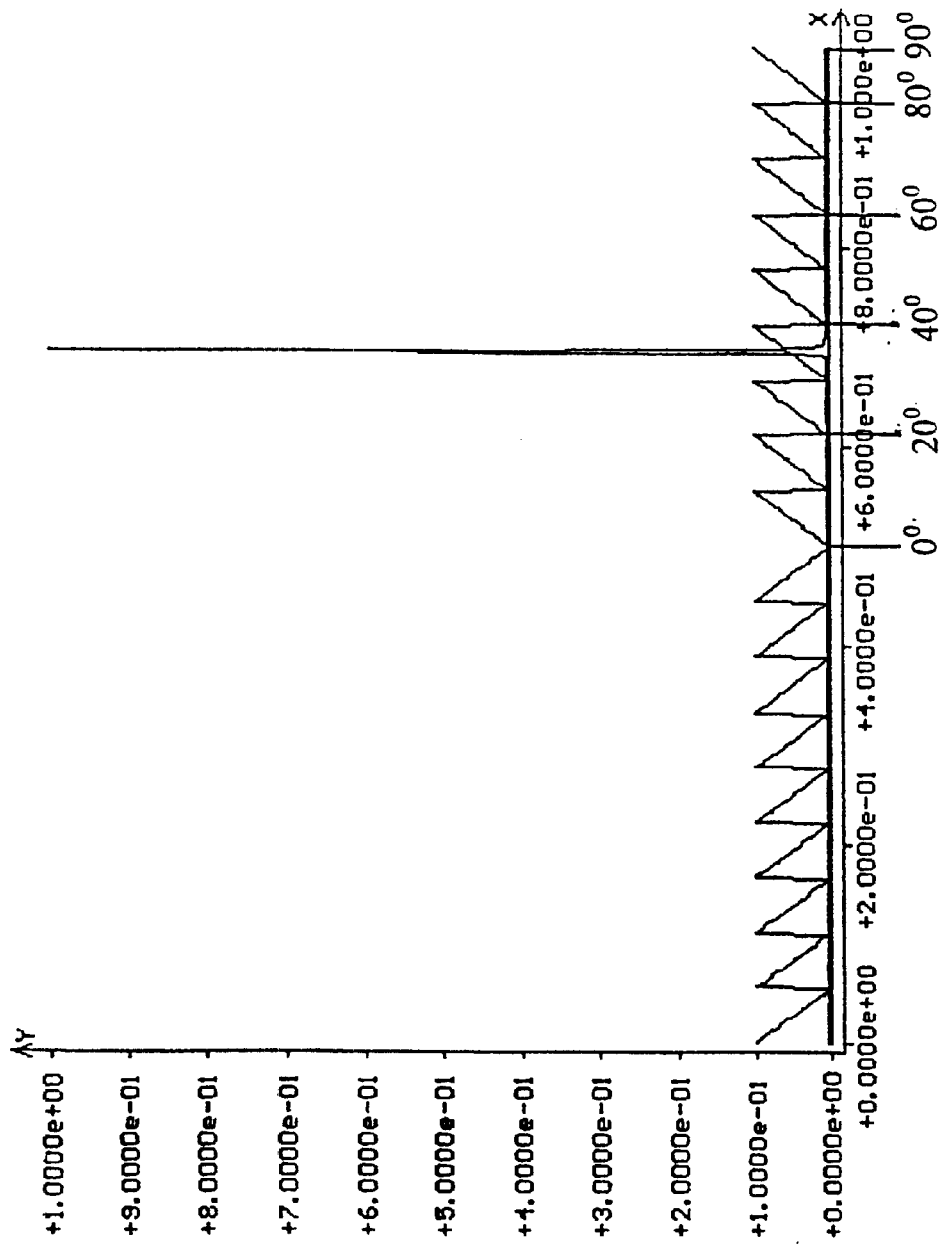
FIG. 6, on axes of lateral position and intensity, depicts a calculated far-field intensity distribution of amplified radiation in a normal plane.

The following results were obtained by numerical calculation for the SOA in question:

- the net loss factor $α_{OR}$ (cm$^{-1}$) for the net outgoing radiation from the active gain region into radiation input-output region 17 is: $α_{OR}$=177.2 cm$^{-1}$;
- the loss factor for outgoing radiation from the active gain region into contact layer 9 is $α'_{OR}$=1×10$^{-5}$ cm$^{-1}$;
- the effective refractive index of the aggregate of laser heterostructure 4 with radiation input-output region 17 is $n_{eff}$=3.4775;
- the near-field distribution of amplified radiation in the plane perpendicular to the layers of laser heterostructure 4 and the layer of radiation input-output region 17 (see FIG. 5); and
- the corresponding far-field distribution of the amplified radiation intensity (see FIG. 6).

We also determined the following on the basis of the assumed parameters and the dimensions of the SOA as in Example 1:

- the angle φ of outflow of radiation from the active gain region into radiation input-output region 17: φ=9°30 ';
- the efficiency of output of outgoing radiation from the active gain region into radiation input-output region 17: $η_1$=0.8986;
- the input efficiency $η_{2in}$ of the input radiation and the output efficiency $η_2$ of the output radiation, which are related to the optical losses (absorption) of the corresponding radiations upon passage through radiation input-output region 17 and to the losses to reflection from the corresponding second optical facets 18 and 19, are: $η_2$=$η_{2in}$≈0.99;
- the differential efficiency is: $η_g$=$η_1$×$η_2$=0.9;
- the output power $P_{out}$ of the amplified radiation for an operating current of 3.825, A is 4.32 W;
- the output radiation is directed at an angle to the plane of the active layer that is equal to the outflow angle φ=9°30', and its angle of divergence $θ_⊥$, in the vertical plane is 3.96 mrad;
- the effective angle of divergence $θ_∥$ of the output radiation in the horizontal plane is 6.12 mrad;
- the areas of the input and output apertures are $S_{in}$=2,475 μm$^2$ and $S_{out}$=39,600 μm$^2$, respectively; and
- the density $ρ_{19}$ of the output amplified radiation on the output optical surface of the second optical facet is: $ρ'_{19}$=1.09×10$^4$ W/cm$^2$.

In the SOA design considered above, laser heterostructures 4 and radiation input-output region 17, which are schematically depicted in FIGS. 7–9, may be modified. If this were done, the characteristics of the SOA would change as follows.

In FIG. 7 the cladding sublayer 25 adjacent to the radiation input-output region is made of two subregions 26 and 27. Selecting a thickness of 0.2 μm bordering on the first optical facet of subregion 27, and a length thereof equal to 0.03 times $L_{AGR}$, we will obtain a significant decrease in the radiation power density in the face of the active gain region on the first optical facet 15.

Figure 11:
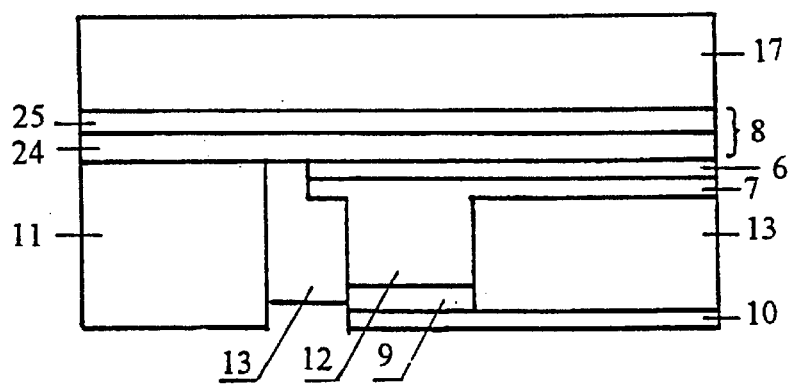
Figure 12:
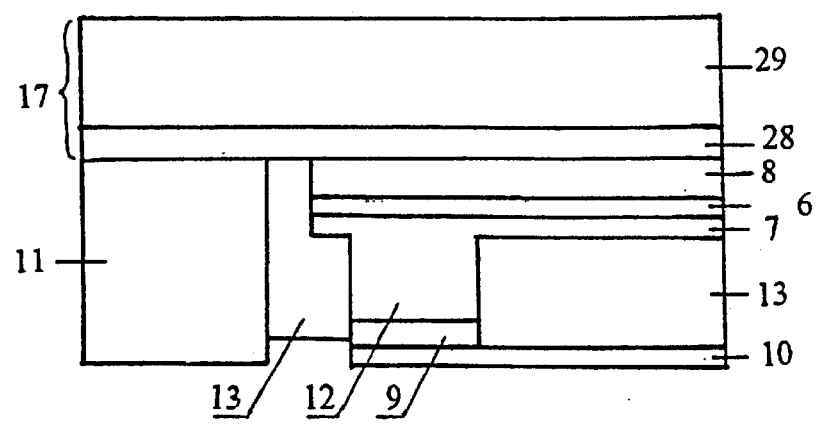
Figure 13:
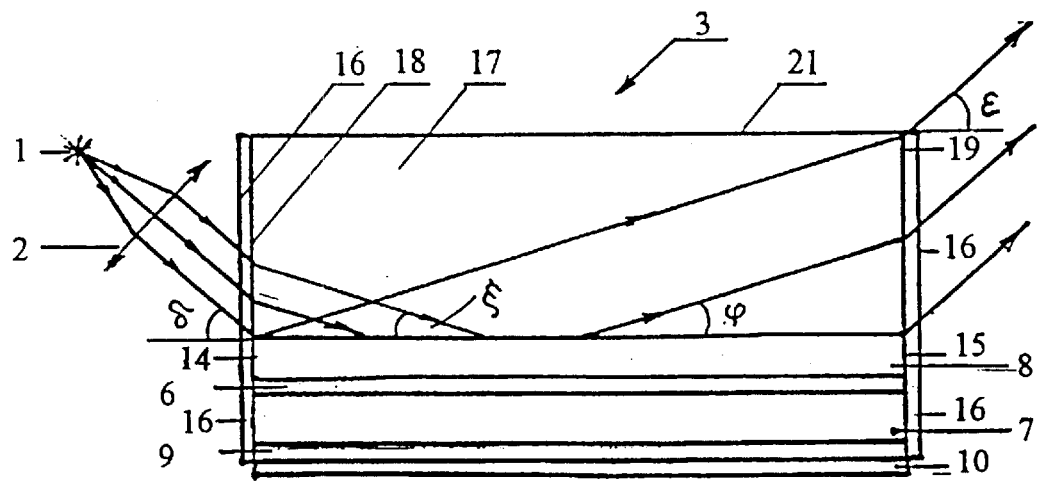
FIGS. 13–16 schematically depict longitudinal cross-sections of different embodiments of the AC having one subregion of the radiation input-output region.

In FIG. 8 radiation input-output region 17 is made of sublayers: the first sublayer 28 is 30 μm thick and is electrically conductive (for a carrier concentration of 3×10$^{18}$ cm$^{-3}$), and the second sublayer 29 is lightly doped to a concentration of 1×10$^{16}$ to 1×10$^{17}$ cm$^{-1}$. In this case, absorption losses can be reduced, and the efficiency of the SOA can be increased, as a result of the additional decrease in the optical loss factor $α_{IOR}$ in the second sublayer 29 of radiation input-output region 17. Here, an ohmic contact 11 can be made directly with sublayer 28 as shown in FIG. 12. Note that in the case of small values of $W_{in}$ and $W_{out}$ ohmic contact 11 can be formed with one of the cladding sublayers of cladding layer 8, which is adjacent to radiation input-output region 17, as shown in FIG. 11.

In FIG. 9 a highly doped additional semiconductor layer 30 whose bandgap is smaller than $E_a$ for active layer 6, such as one made of In$_{0.5}$Ga$_{0.5}$As, is placed on radiation input-output region 17 on the side opposite laser heterostructure 4. The presence of this layer 30 leads to additional stabilization of the operation of the SOA as a result of the absorption of possible spurious optical reflections, and at the same time will make it possible to decrease the resistance of ohmic contact 11. Furthermore, if necessary, the stabilization of the operation of the SOA can be intensified by varying the inclination of the second optical facet 19 to a value such that the amplified radiation reflected from it is not incident on the active gain region.

Figure 10:
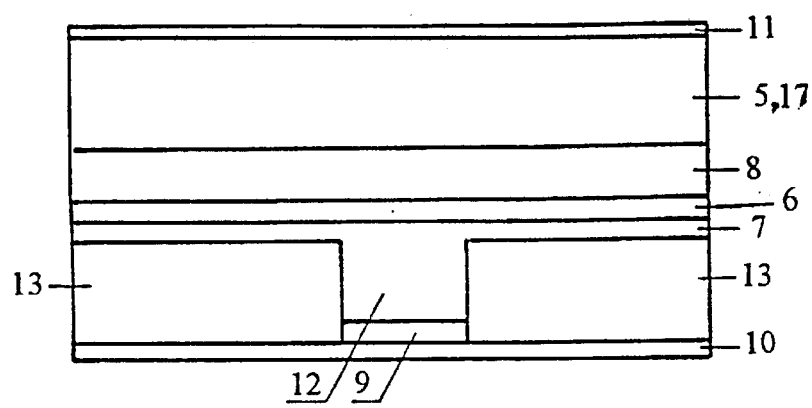
FIGS. 10–12 schematically depict cross-sections of the AC in the SOA with various ohmic contacts.

In other embodiments of the SOA in question, as depicted in FIGS. 1, 2, and 10, the active region was formed by a strip with a width $W_{in}$=$W_{out}$=200 μm; the length $L_{AGR}$ on the order of $L_{IOR-I}$ and the thickness $d_{IOR}$ of radiation input-output region 17 were chosen to be 10,000 μm and 1,700 μm. Note that when this was done condition (10) was fulfilled. The previously considered first embodiment of the proposed SOA was selected as the master source 1 of output radiation with 4.32 W of power (for an operating current of 3.825 A). Optical system 2 for shaping the input radiation was not present, and the output radiation of master source 1 was sent directly on the normal to the plane of the second optical facet (not shown in FIG. 1). The main difference in this embodiment lay in the significant increase in the power of the amplified radiation at the output of the SOA ($P_{out}$ is 72 W) and in the decrease in the angle of divergence $θ_⊥$ in the vertical plane ($θ_{195}$ is equal to 0.6 mrad).

The other embodiments of the SOA shown in FIGS. 13–16 differed from the ones considered above in the size of the angles of inclination of the second optical facets. For the SOA (see FIG. 13) both optical facets 18 and 19 were parallel to the normal plane. This led to a situation in which the input angles δ of the collimated input radiation and angle of refraction ε for the amplified output diffraction-limited radiation were the same:

$$δ=ε=\arcsin(n_{IOR}\sinφ)=35°30'.$$

In the next embodiment of the SOA (see FIG. 14), the second optical facet 18 was made parallel to the normal plane, and the second optical facet 19 was at an angle of inclination $ψ_4$ equal to the outflow angle φ, specifically 9°30'. This embodiment differed from the previous one in that the amplified radiation emerged through optical facet 19 on the normal to it (the angle of refraction ε was zero).

For the SOA (see FIG. 15) both second optical facets 18 and 19 of radiation input-output region 17 were made at angles of inclination $\psi_3$ and $\psi_4$ equal to $(\pi/2-\phi/2)$, in this case 40°15', which were obtuse relative to the inner surface 20 of radiation input-output region 17. Here the collimated input radiation and amplified output radiation were directed on the normal to outer surface 21 of radiation input-output region 17.

Figure 16:
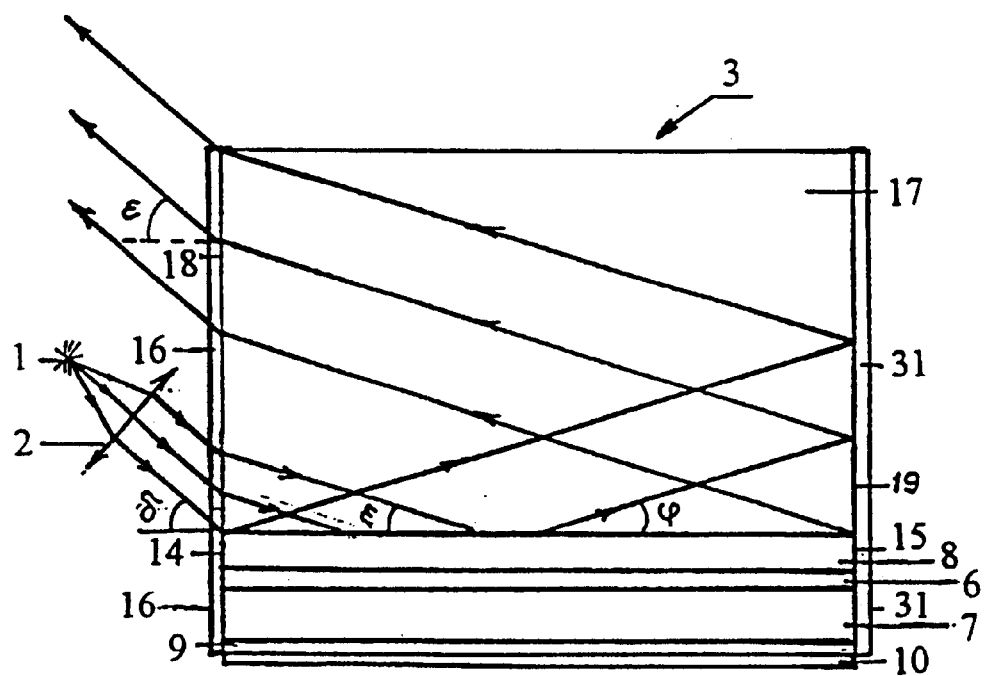

FIG. 16 depicts one embodiment of the proposed two-pass SOAs in which amplification of the input radiation takes place not only during forward traversal but also during return traversal of the active gain region as a result of the formed reflective coatings 31 to the first optical facet 15 and the second optical facet 19. The latter were made, as in the SOA in FIG. 13, parallel to the normal plane. In the proposed embodiment of the two-pass SOA, there is more efficient use of the length $L_{AGR}$; here, the input and output of amplified radiation on second optical facet 18 are spatially separated, and the values of the angles $\delta$ and $\epsilon$ are the same as for the SOA in FIG. 13.

Figure 17:
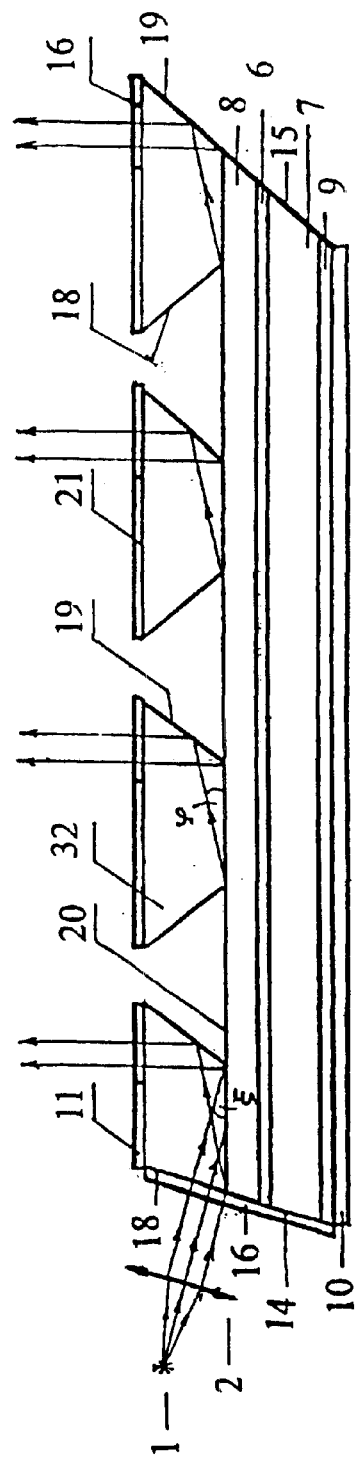
FIGS. 17–18 schematically depict longitudinal cross-sections of the SOA with radiation input-output regions separated by second optical facets into several subregions, with radiation input through an input surface of a first subregion and multiple beam radiation output.
Figure 18:
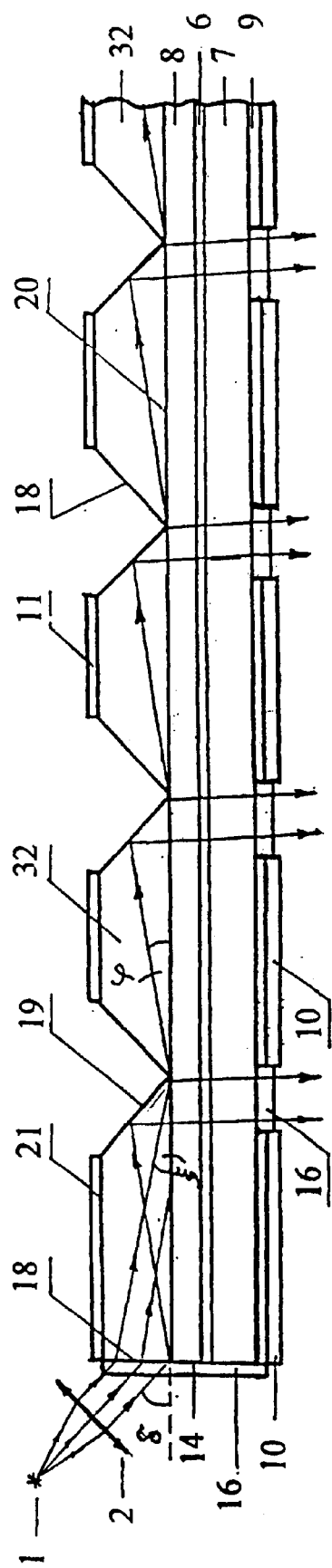
Figure 19:
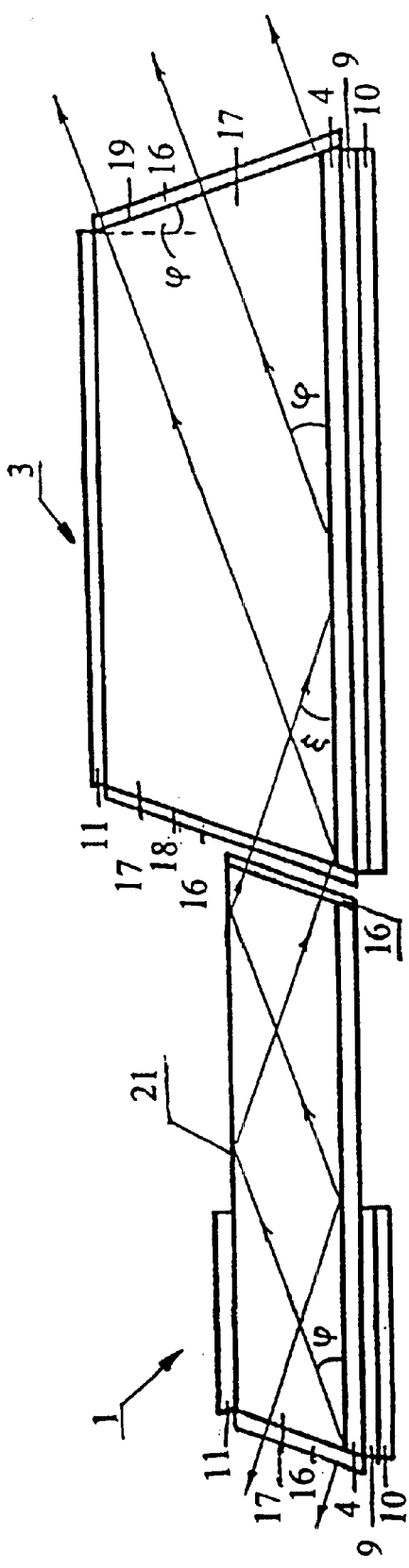
FIG. 19 schematically depicts a longitudinal cross-section of a discrete SOA with superluminescent radiation that includes as a master element, an amplifying component.
Figure 20:
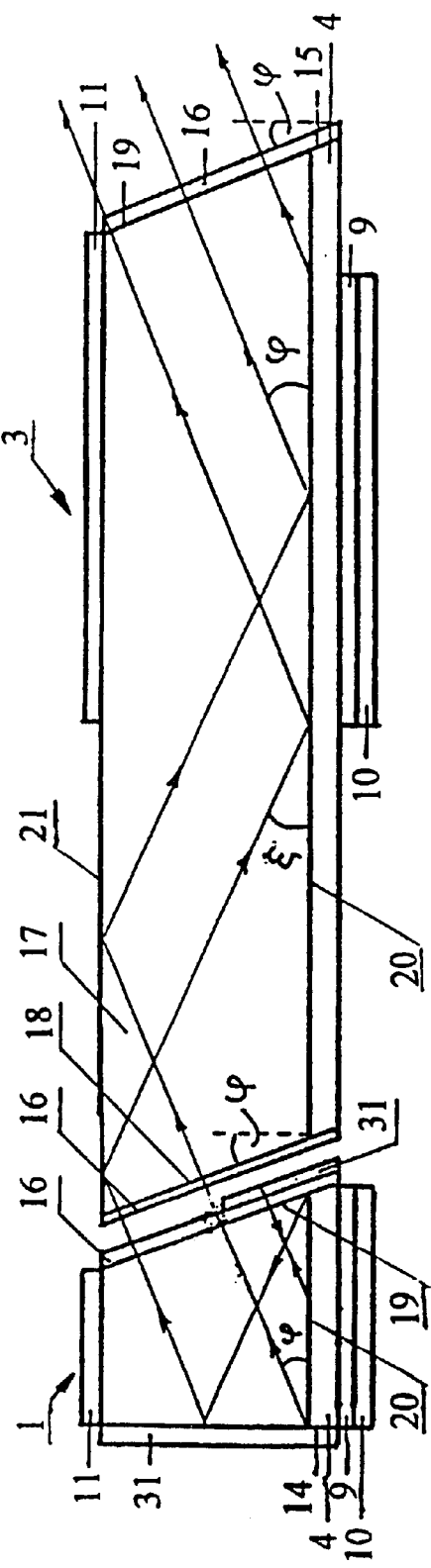
FIG. 20 schematically depicts a longitudinal cross-section of a discrete SOA in that includes as the master component an injection laser with a radiation-output region.

The designs of multibeam SOAs depicted in FIGS. 17–18 are applicable for a number of applications in fiber-optic communications lines for fabrication of optical power amplifiers in branched communications networks. In these SOAs radiation input-output region 17 consists of a series of subregions 32, which are successively positioned along the gain axis at equal distances from each other and are separated by the second optical facets 19 and 18. In the SOA embodiment according to FIG. 17, the second optical facets 18 and 19, except the second optical facet 18 to which the input radiation is supplied from master source 1, are formed for each subregion 32 at angles of inclination $\psi_3$ and $\psi_4$ that are equal to each other and have a value of 40°15'. The input radiation from master source 1 is input into AC 3 as depicted for the SOA embodiment in FIG. 1. After traversing the first subregion 32 of radiation input-output region 17, the radiation will be output, as described previously, after reflection from the second optical facet 19 of the aforementioned subregion 32 through the output surface, which is on the projection of the aforementioned second optical facet 19 onto the outer surface 21 of radiation input-output region 17. The remainder of the amplified radiation propagated in the active gain region will enter the next analogous second subregion 32 of radiation input-output region 17, and the aforementioned process will be successively repeated in all subsequent subregions 32 of radiation input-output region 17.

In another embodiment of the multibeam AC 3 of the proposed SOA (see FIG. 17), the second optical facets 19 and 18 of each of the subregions 32 are formed at acute angles to active layer 6 and intersect on the inner surface 20 of radiation input-output region 17. Input of the input radiation into the first subregion 32 is performed by analogy with the SOA design in FIG. 13. Output of the outgoing amplified radiation is performed upon total internal reflection from the second optical facets 19 in the direction of laser heterostructure 4. The angle of inclination $\psi_4$ of the aforementioned facets was chosen from the range from $(\pi/4+\phi/2-\sigma/2)$ to $(\pi/4+\phi/2-\sigma/2)$ and is 51° (for an outflow angle $\phi$ of 9°30'). At the point where the rays emerge, the contact layer 9 and ohmic contact 10 are removed, and antireflective coating 16 is applied.

FIGS. 19–24 depict other modifications of the proposed SOAs, including integrated ones (see FIGS. 21–24). In the latter, output-input-output of radiation are accomplished within the unified radiation input-output region 17.

SOAs (see FIGS. 19 and 21) in which a second amplifying component (MS-AC 1) (see FIG. 19) analogous to AC 3, or a second active gain region (see FIG. 21), which in the absence of feedback will be sources of directional superluminescent radiation in the discrete (see FIG. 19) and integrated design (see FIG. 21), are used as master source 1. To accomplish efficient input of input radiation into AC 3 from MS-AC 1, all inflow angles $\xi$ and outflow angles $\phi$ were chosen to be identical, and the outer surfaces 21 in MS-AC 1 (see FIG. 19) and in the integrated SOA (see FIG. 21) were made reflective (total internal reflection from the surface).

Figure 14:
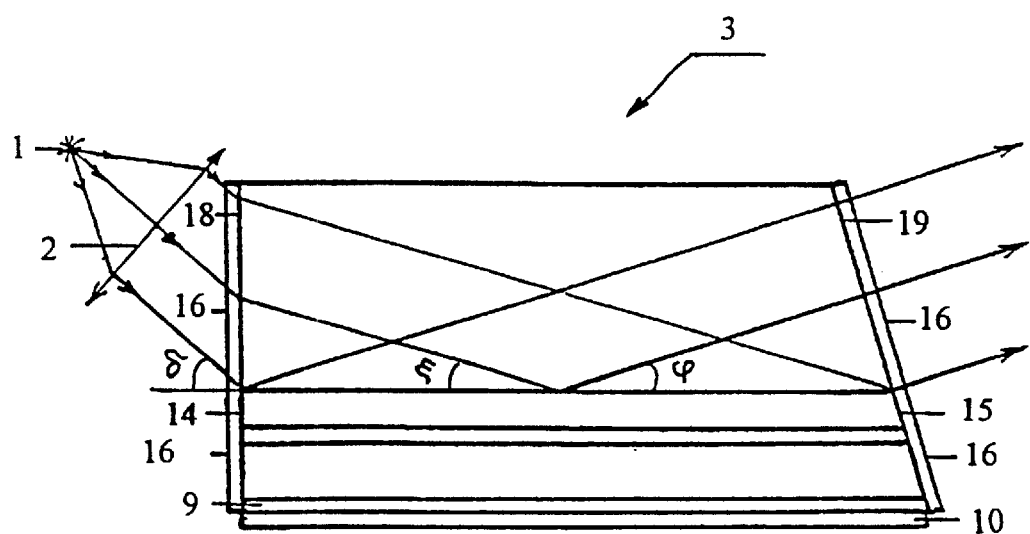
Figure 15:
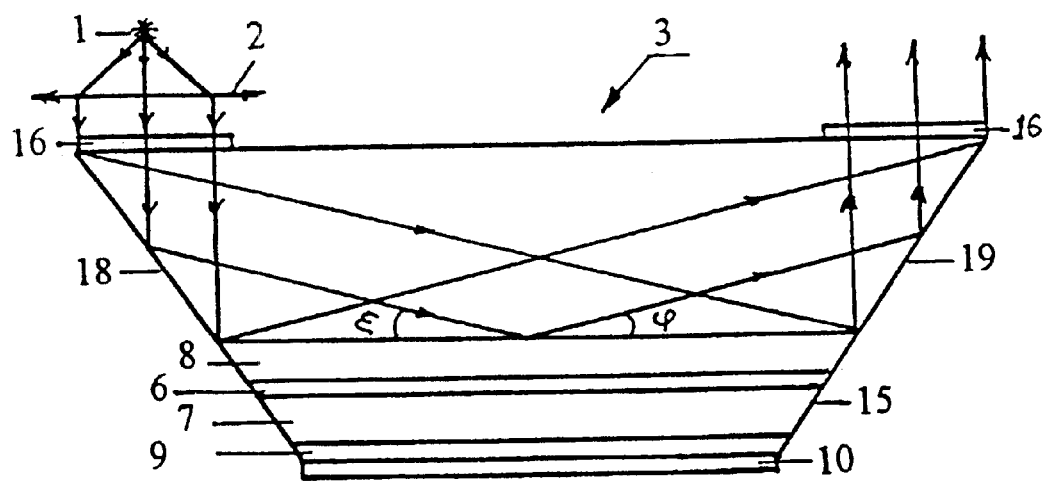

To implement MS-AC 1 as a coherent emitter (see FIG. 20), we selected for it the design of AC 3 depicted in FIG. 14, with additionally formed reflective coatings 31 on the first optical facets 14 and 15, on second optical facet 18, and in part on second optical facet 19. In this case, by virtue of the generation of feedback MS-AC 1 acquires the properties of a laser diode, and the outgoing radiation generated by it, after being reflected from reflective coating 31 on second optical facet 18 without any optical system, is effectively coupled to AC 3. Here, second optical facet 18 of AC 3 must be built in parallel to second optical facet 19 of MS-AC 1.

Figure 21:
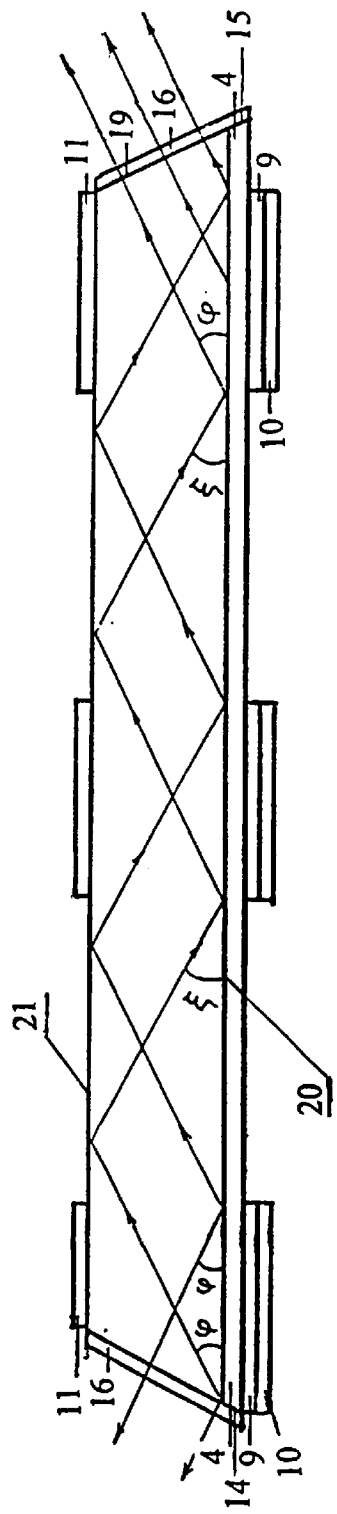
FIGS. 21–24 schematically depict various embodiments of integrated semiconductor optical amplifiers (SOAs)
Figure 23:
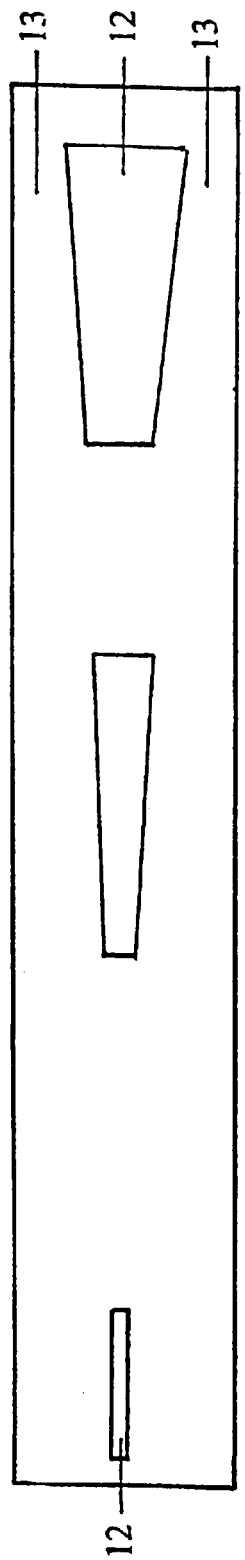
Figure 22:
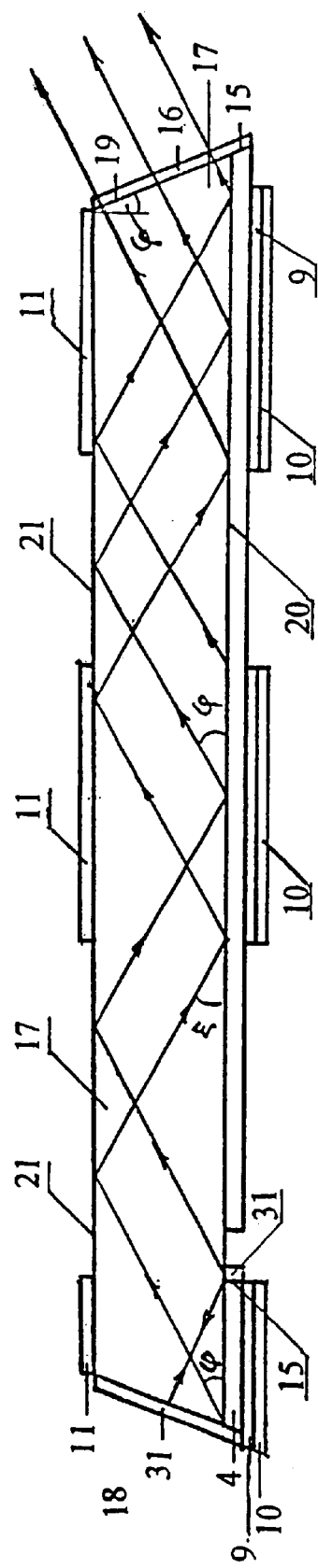

The SOAs depicted in FIGS. 21–24 (in contrast to FIGS. 19–20) include several interconnected ACs 3, which operate in a multistage amplifier circuit: the output of the amplified radiation of one amplifier is the input of the next. The active gain regions of master source 1 and all ACs 3 for the SOAs according to FIGS. 21–23 are positioned along the gain axis on one inner surface of radiation input-output region 17. Here, coupling between the active gain regions is achieved as a result of total internal reflection from the outer surface of the radiation input-output region 17 common to them; the longitudinal distance between the initial points of the active gain regions was selected to be $2d_{IOR}/\tan\phi$.

Figure 24:
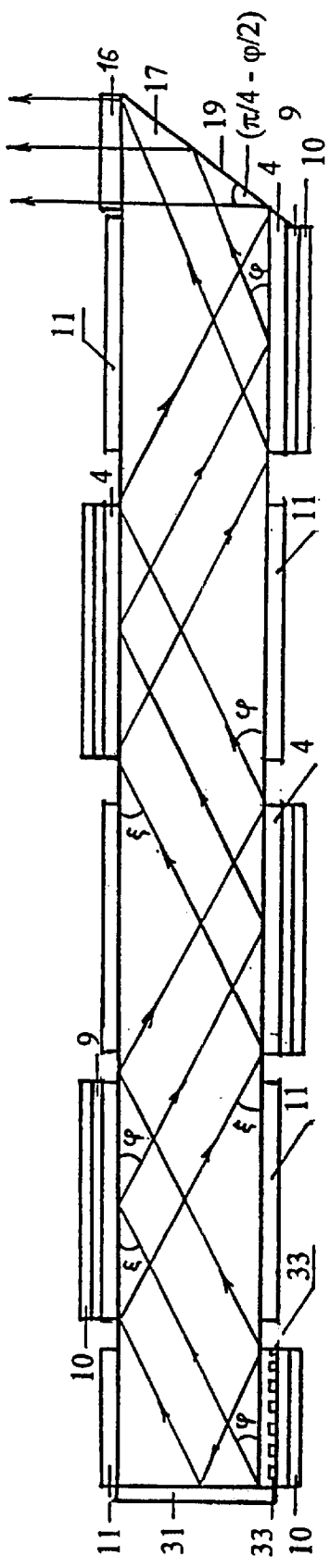

For the SOA depicted in FIG. 24, beginning with master source 1 the active gain regions are positioned alternately on opposite surfaces of radiation input-output region 17, with selection of the shortest distance between the initial faces of the active gain regions on opposite surfaces to be $d_{IOR}/\sin\phi$.

A feature of the proposed SOA using discrete components (see FIG. 19) is that the thickness of radiation input-output region 17 for AC 3 is greater than the thickness of radiation input-output region 17 in MS-AC 1. This makes it possible to reduce, without degradation of other parameters, the diffraction angle of divergence for the amplified output radiation and also, if necessary, to increase the distance between the active gain regions in the case of a multistage amplifier.

A feature of the integrated SOA (see FIG. 24) is that, to effect lasing at one wavelength, optical feedback in the active gain region of master source 1 is formed by distributed retrodirective microreflectors 33, whose spacing is related in a known way to the wavelength of the radiation being generated (Handbook of Semiconductor Lasers and Photonic Integrated Circuits, edited by Y. Sucmatsu and A. R. Adams, Chapman-Hill, London, 1994, pp. 402–407). The active gain regions in AC 3 are made expandable so that the width $W_{in}$ of each successively active gain region of AC 3 exceeds the width $W_{out}$ of the previous one to the extent that the losses of the radiation being amplified are insignificant. The amplified output radiation of such a SOA should distinguish not only the monofrequency nature of its radiation but also the ability to obtain high output powers with small angles of divergence in both the vertical and horizontal planes with low astigmatism.

Thus, in comparison with the prior art (L. Goldberg et al., *IEEE J. Of Quantum Electronics* (1993), vol. 29, No. 6, pp. 2028–2042), in the proposed SOAs the input and output apertures of AC 3 are increased by a factor of more than 200, the divergences for the input radiation and amplified output radiation are reduced by the same factor (here, diffraction-divergent radiation was obtained in two mutually perpendicular directions), the effective length of the gain region in the SOA is increased by a factor of 6.6, and the output radiation power is increased by a factor of almost 30.

In addition to injection lasers, semiconductor optical amplifiers are used to pump solid-state and fiber lasers, in building laser radiation sources in the visible region of the spectrum (red, green, and blue light) using second-harmonic generation in nonlinear optical crystals, medical equipment, laser process equipment, and systems for energy and data transmission over large distances, in modern fiber-optic communications systems.

The present invention may be embodied in other specific forms without departing from the essential characteristics as described herein. The embodiments described above are to be considered in all respects as illustrative only and not restrictive in any manner. The scope of any invention is, therefore, indicated by the following claims rather than the foregoing description. Any and all changes which come within the meaning and range of equivalency of the claims are to be considered in their scope.

$$0 < \arccos \frac{n_{\text{eff}}}{n_{IOR1}} \leq \arccos \frac{n_{\text{eff-min}}}{n_{IOR1}}, \text{ and } n_{\text{eff-min}} > n_{\min},$$

wherein $n_{\text{eff}}$ is the effective refractive index $n_{\text{eff}}$ of said heterostructure in aggregate with said radiation input-output region, and $n_{IOR1}$ is the refractive index of said radiation input-output region, $n_{\text{eff-min}}$ is the minimum value of $n_{\text{eff}}$ out of all possible $n_{\text{eff}}$ for said multiplicity of heterostructures that are of practical interest, in aggregate with radiation input-output regions, and $n_{\min}$ is the smallest of said refractive indices of said layers of said heterostructure.

2. A semiconductor optical amplifier as in claim 1, wherein said input radiation entering said amplifier is substantially collimated.

3. A semiconductor optical amplifier as in claim 2, wherein said input angle δ of said input radiation on an input surface of said amplifying component is such that radiation into said amplifying component is incident at an inflow angle ξ and is emitted therefrom at an outflow angle φ substantially equal to arccos($n_{\text{eff}}/n_{IOR1}$), said inflow angle ξ being defined by a normal of an input ingoing radiation front to a plane of said active layer and said outflow angle φ,

TABLE 1

| Name, No. of layers of regions 1 | | Composition of layer 2 | Thickness d of layer (μm) 3 | Refractive index n 4 | Type of conduction 5 | Carrier concentration $N_e$ (cm$^{-3}$) 6 | Optical loss factor α (cm$^{-1}$) 7 |
|---|---|---|---|---|---|---|---|
| Contact layer | 9 | GaAs | 0.3 | 3.52 | P | $2 \times 10^{19}$ | 20.0 |
| Cladding | 7 23 | Al$_{0.5}$Ga$_{0.5}$As | 1.2 | 3.25 | P | $1 \times 10^{18}$ | 7.0 |
| Layer | 7 22 | GaAs | 0.3 | 3.525 | — | — | 2.0 |
| Active layer | 6 | In$_{0.2}$Ga$_{0.8}$As | 0.008 | 3.63 | — | — | 2.0 |
| Cladding | 8 24 | GaAs | 0.2 | 3.525 | — | — | 2.0 |
| Layer | 8 25 | Al$_{0.15}$Ga$_{0.85}$As | 0.512 | 3.45 | N | $1 \times 10^{18}$ | 2.0 |
| Radiation input-output region 1 | 5–17 | GaAs | 260.0 | 3.525 | N | $1 \times 10^{18}$ | 0.001 |

What is claimed is:

1. A semiconductor optical amplifier comprising:

a master source of input radiation; and an amplifying component optically coupled to said master source, said amplifying component comprising a semiconductor heterostructure that includes an active layer positioned between two cladding layers;

an ohmic contact formed to at least one sublayer of said semiconductor heterostructure; and an input-output region for radiation to which it is transparent comprising at least one additional layer on at least one side of said heterostructure, said additional layer adjacent to said heterostructure comprising one or more sublayers having refractive indices $n_{IORq}$ and optical loss factors $\alpha_{IORq}$ (cm$^{-1}$), where q=1, 2, . . . , p are integers corresponding to said sublayers of said radiation input-output region sequentially counted from their boundaries with said heterostructure, wherein said semiconductor optical amplifier is adapted such that said input-output region receives input radiation at an angle of input, δ, said angle of said input radiation and said net loss factor $\alpha_{OR}$ (cm$^{-1}$) for said amplified radiation flowing from said active layer are such that defined by a normal of outgoing amplified radiation with respect to said plane of said active layer.

4. A semiconductor optical amplifier as in claim 1, wherein said semiconductor heterostructure and said input-output region are selected such that said net loss factor $\alpha_{OR}$ (cm$^{-1}$) for amplified radiation emerging from said active layer at said boundary between said sublayer of said cladding layer and said radiation input-output region is selected from a range of values bounded by a lower limit $\alpha_{ORmin}$ (cm$^{-1}$) and an upper limit $\alpha_{ORmax}$ (cm$^{-1}$) established by a permissible minimum value of efficiency of conversion of electric power supplied to said active gain region into amplified radiation power and also by a maximum permissible value of said operating-current density.

5. A semiconductor optical amplifier as in claim 1, further comprising barrier regions, and wherein said amplifying component comprises at least one active gain region having width $W_{in}$ (μm) at its start and a width $W_{out}$ (μm) at its end and having a length $L_{AGR}$ (μm) with first optical facets that serve as boundaries on face sides defining said start and end of said active gain region, and that are inclined at angles $\psi_1$ and $\psi_2$ with a normal plane perpendicular to a longitudinal axis extending said length $L_{AGR}$ of said active layer.

6. A semiconductor optical amplifier as in claim 5, wherein $W_{in}$ (μm) is substantially equal to $W_{out}$ (μm).

7. A semiconductor optical amplifier as in claim 5, wherein $W_{out}$ is larger than $W_{in}$.

8. A semiconductor optical amplifier as in claim 1, wherein said radiation input-output region has a width no smaller than said widths of said active gain region, and said radiation input-output region has an inner surface bordering said heterostructure of length $L_{IOR-I}$ (μm) no shorter than said length $L_{AGR}$ (μm) of said active region.

9. A semiconductor optical amplifier as in claim 1, wherein said radiation input-output region comprises optically homogeneous material.

10. A semiconductor optical amplifier as in claim 9, wherein said active layer comprises semiconductor having a bandgap $E_a$ (eV) and said radiation input-output region comprises semiconductor having a bandgap $E_{IOR}$ (eV) that exceeds said bandgap for said active layer $E_a$ (eV) by more than 0.09 eV.

11. A semiconductor optical amplifier as in claim 1, wherein that said radiation input-output region has a thickness $d_{IOR}$ between about 5 to 50,000 μm.

12. A semiconductor optical amplifier as in claim 1, wherein said active layer has a medial plane located at a distance from said inner surface of said additional layer such that said amplified radiation intensity in said medial plane differs from said maximum intensity by no more than 20%.

13. A semiconductor optical amplifier as in claim 1, wherein at least one of said sublayers of said cladding layers of said heterostructure has a refractive index equal to or greater than $N_{IOR1}$.

14. A semiconductor optical amplifier as in claim 1, wherein said heterostructure layer adjacent to said radiation input-output region comprises at least two regions whose bordering surfaces are perpendicular to a plane of parallel to said active layer.

15. A semiconductor optical amplifier as in claim 14, wherein said adjacent regions in said radiation input-output region have refractive indices that are different.

16. A semiconductor optical amplifier as in claim 14, wherein said adjacent regions have thicknesses that are different.

17. A semiconductor optical amplifier as in claim 1, wherein said outer additional layer comprises material that absorbs said radiation being amplified.

18. A semiconductor optical amplifier as in claim 1, wherein said additional layers are substantially electrically conductive.

19. A semiconductor optical amplifier as in claim 18, further comprising an ohmic contact formed with one of said additional layers.

20. A semiconductor optical amplifier as in claim 1, wherein said radiation input-output region is substantially electrically conductive.

21. A semiconductor optical amplifier as in claim 20, wherein in an ohmic contact is formed with said surface of said radiation input-output region.

22. A semiconductor optical amplifier as in claim 1, wherein said radiation input-output region has an optical loss factor $\alpha_{IROq}$ that is not greater than 0.1 cm$^{-1}$.

23. A semiconductor optical amplifier as in claim 1, wherein said radiation input-output region comprises two sublayers, a first sublayer that borders on said laser heterostructure and is electrically conductive and a second layer that comprises material with an optical loss factor $\alpha_{IOR2}$ of no more than 0.1 cm$^{-1}$.

24. A semiconductor optical amplifier as in claim 23, further comprising an ohmic contact made with said first sublayer of said radiation input-output region.

25. A semiconductor optical amplifier as in claim 1, wherein at least one of said sublayers of said cladding layer is electrically conductive and is positioned between said active layer and said radiation input-output region, and wherein said optical amplifier further comprises an ohmic contact from said direction of said radiation input-output region made with one of said electrically conductive sublayers of said cladding layer that is positioned between said active layer and said radiation input-output region.

26. A semiconductor optical amplifier as in claim 25, wherein said ohmic contact is made with said electrically conductive layer having a bandgap value smaller than other of said electrically conductive layers.

27. A semiconductor optical amplifier as in claim 1, further comprising a second optical facet having an antireflective coating, said second optical facet being located in said radiation input-output region proximal to said radiation input and being oriented parallel to a normal plane perpendicular to a longitudinal axis extending a length $L_{AGR}$ of said active layer, and wherein said radiation input angles δ satisfies the condition arcsin ($n_{IORq}$ sin ξ).

28. A semiconductor optical amplifier as in claim 1,
further comprising an antireflective coating formed on a part of said radiation input-output region that is opposite an inner surface of said input-output region bordering said heterostructure, and that is adjacent to a second optical facet that receives said input radiation,
wherein said second optical facet subtends an obtuse angle with said plane of said active layer and is formed at an angle of inclination $\psi_3$ to a normal plane perpendicular to said active layer ranging between about

[(π/4)−(ξ/2)−(σ/2)] to [(π/4)−(ξ/2)+(σ/2)], where σ is the angle of total internal reflection for said outgoing radiation in said radiation input-output region.

29. A semiconductor optical amplifier as in claim 28, wherein said angle of inclination $\psi_3$ is selected to be [(π/4)−(ξ/2)], and said output radiation is directed along a normal to said input surface.

30. A semiconductor optical amplifier as in claim 1, further comprising
a second optical facet having an antireflective coating, said second optical facet being located on said radiation input-output region proximal to said input radiation,
wherein said second optical facet which subtends an acute angle with said plane of said active layer and is formed at an angle of inclination $\psi_3$ to a normal plane perpendicular to said active layer ranging between about (ξ−σ) to (ξ+σ).

31. A semiconductor optical amplifier as in claim 30, wherein said angle of inclination $\psi_3$ is equal to an angle ξ corresponding to radiation inflow into said heterostructure, and said output radiation is directed along a normal to said input surface.

32. A semiconductor optical amplifier as in claim 1, further comprising a second optical facet having an antireflective coating, said second optical facet being located on said radiation input-output region proximal to said output radiation,
wherein said second optical facet subtends an acute angle with said plane of said active layer and is formed at an angle of inclination $\psi_4$ to a normal plane perpendicular to said active layer ranging between about (φ−σ) to (φ+σ).

33. A semiconductor optical amplifier as in claim 32, wherein said angle of inclination $\psi_4$ is equal to said outflow angle φ corresponding to radiation outflow from said heterostructure.

34. A semiconductor optical amplifier as in claim 32, wherein said radiation input-output region comprises at least two subregions, said first of which is optically coupled to said master source, said subregions being separated by second optical facets for output of radiation from each subregion.

35. A semiconductor optical amplifier as in claim 34, wherein said second optical facets in said direction of radiation output subtend an acute angle with respect to a plane coincident with said active layer and are formed at an angle of inclination $\psi_4$ with respect to a perpendicular to a surface of said active layer that ranges from about $[(\pi/4)+(\phi/2)-(\sigma/2)]$ to $[(\pi/4)+(\phi/2)+(\sigma/2)]$, wherein said amplifying component further comprises antireflective coatings formed in said regions of their projections on a surface of said heterostructure opposite said location of said radiation input-output region.

36. A semiconductor optical amplifier as in claim 1, further comprising
a second optical facet having an antireflective coating, said second optical facet being located on said radiation input-output region proximal to said output radiation,
wherein said second optical facet is parallel to a normal plane perpendicular to said active layer, and
wherein said amplifier is adapted such that output radiation exits from said heterostructure at an outflow angle $\phi$ that is smaller than the angle of total internal reflection $\sigma$ from said facet.

37. A semiconductor optical amplifier as in claim 1, further comprising
a reflective coating on a second optical facet, and one formed parallel to said normal plane; and
an antireflective coating is made on another, opposite second optical facet,
wherein radiation input is provided through one part of said antireflection coating, which is located, at one end at a boundary of said second optical facet with an inner surface of said radiation input-output region adjacent said active layer, at a distance of no more than $L_{AGR}$ tan $\phi$, and
wherein radiation output is provided through said same facet in another part thereof.

38. A semiconductor optical amplifier as in claim 37, comprising a reflective coating on said first optical facet adjacent said second optical facet with said reflective coating.

39. A semiconductor optical amplifier as in claim 1, further comprising an antireflective coating on a part of said radiation input-output region surface opposite an inner surface of said input-output region adjacent said active layer, said antireflective coating being positioned adjacent to said second optical facet from said direction of radiation output,
wherein said second optical facet subtends an obtuse angle with a plane parallel to said active layer and formed at an angle of inclination $\psi_4$ with respect to a perpendicular to said active layer ranging from about $[(\pi/4)-(\phi/2)-(\sigma/2)]$ to $[(\pi/4)-(\phi/2)+(\sigma/2)]$.

40. A semiconductor optical amplifier as in claim 39, wherein said angle of inclination $\psi_4$ is selected to be $[(\pi/4)-(\phi/2)]$, and said output radiation is directed along a normal to said output surface.

41. A semiconductor optical amplifier as in claim 1, further comprising at least two active gain regions having a substantially identical inflow angle $\xi$ and outflow angle $\phi$ for each gain region formed on a same surface of said radiation input-output region.

42. A semiconductor optical amplifier as in claim 41, wherein at least two active gain regions are formed along a same line parallel to a surface of said radiation input-output region and to a plane of said active layer, with a spacing $2d_{IOR}/\tan \phi$ between said edges of said active regions.

43. A semiconductor optical amplifier as in claim 41, wherein at least part of at least one surface of said radiation input-output region is reflective.

44. A semiconductor optical amplifier as in claim 43, wherein said radiation input-output region comprises reflective coatings.

45. A semiconductor optical amplifier as in claim 43, comprising reflectors associated with said radiation input-output region that comprise distributed Bragg reflectors.

46. A semiconductor optical amplifier as in claim 43, further comprising reflectors associated with said radiation input-output region comprising distributed feedback reflectors along an entire length of said active gain region of said master source.

47. A semiconductor optical amplifier as in claim 1, wherein at least one active gain region having an identical inflow angle $\xi$ and outflow angle $\phi$ for each said active gain region, are on opposite surfaces of said radiation input-output region.

48. A semiconductor optical amplifier as in claim 47, wherein at least one active gain region is formed along each of two lines that are parallel to each other and that are located on opposite surfaces, said shortest distance between edges of said active gain regions on opposite sides being $d_{IOR}/\sin \phi$.

49. A semiconductor optical amplifier as in claims 1, wherein said master source of input radiation comprises a second amplifying component.

50. A semiconductor optical amplifier as in claim 49, further comprising reflectors associated with said active gain region of said second amplifying component.

51. A semiconductor optical amplifier as in claim 1, further comprising an active gain region associated with said master source, said active gain layer being located on said radiation input-output region of said amplifying component, and said outflow angle $\phi$ of said active gain region of said master source being identical to said inflow angle $\xi$ of said active gain region of said amplifying component.

52. A semiconductor optical amplifier as in claim 51, further comprising reflectors associated with said active gain region of said master source.

53. A semiconductor optical amplifier as in claim 51, wherein said active gain regions of said master source and amplifying component are located on a same inner surface of said radiation input-output region.

54. A semiconductor optical amplifier as in claim 53, wherein said active gain regions of said master source and amplifying component are located on a same line parallel to a surface of said radiation input-output region and to a plane of said active layer, with a spacing $2d_{IOR}/\tan \phi$ between edges of said active regions.

55. A semiconductor optical amplifier as in claim 51, wherein said active gain regions of said master source and amplifying component are located on opposite surfaces of said radiation input-output region.

56. A semiconductor optical amplifier as in claim 55, wherein said active gain regions of said master source and amplifying component are located along each of two lines that are parallel to each other and that are located on opposite surfaces, said shortest distance between said edges of said active gain regions on opposite surfaces being $d_{IOR}/\sin \phi$.

* * * * *